(12) United States Patent
Moon et al.

(10) Patent No.: US 11,800,731 B2
(45) Date of Patent: Oct. 24, 2023

(54) ORGANIC ELECTROLUMINESCENT DEVICE

(71) Applicant: Solus Advanced Materials Co., Ltd., Iksan (KR)

(72) Inventors: Jonghun Moon, Yongin (KR); Taehyung Kim, Yongin (KR); Hocheol Park, Yongin (KR); Songie Han, Yongin (KR)

(73) Assignee: Solus Advanced Materials Co., Ltd., Iksan (KR)

( * ) Notice: Subject to any disclaimer, the term of this patent is extended or adjusted under 35 U.S.C. 154(b) by 150 days.

(21) Appl. No.: 17/190,398

(22) Filed: Mar. 3, 2021

(65) Prior Publication Data

US 2021/0367178 A1 Nov. 25, 2021

(30) Foreign Application Priority Data

May 12, 2020 (KR) .................. 10-2020-0056397

(51) Int. Cl.
*H10K 50/11* (2023.01)
*H10K 50/15* (2023.01)
(Continued)

(52) U.S. Cl.
CPC ........... *H10K 50/11* (2023.02); *H10K 50/156* (2023.02); *H10K 50/166* (2023.02); *H10K 50/171* (2023.02); *H10K 2101/40* (2023.02)

(58) Field of Classification Search
CPC ............... H01L 51/5004; H01L 51/508; H01L 51/5092; H01L 51/0067; H01L 51/5012; H01L 51/5016; H01L 51/5096; H01L 2251/552; H01L 51/5024; H01L 51/504; H01L 51/5088; H01L 51/50–56; H01L 51/0032–0095; H01L 27/32;
(Continued)

(56) References Cited

U.S. PATENT DOCUMENTS

2009/0102368 A1* 4/2009 Shitagaki ............ H01L 51/5048
313/504
2013/0001542 A1 1/2013 Okajima
(Continued)

FOREIGN PATENT DOCUMENTS

JP H10168444 A 6/1998
JP 2014513418 A 5/2014
(Continued)

OTHER PUBLICATIONS

EP Search Report dated Sep. 16, 2021.
(Continued)

*Primary Examiner* — Julio J Maldonado
*Assistant Examiner* — Mohammad A Rahman
(74) *Attorney, Agent, or Firm* — Harvest IP Law, LLP

(57) ABSTRACT

The present invention provides an organic electroluminescent device including an electron-leakage suppression layer and a hole-leakage suppression layer adjusted to have predetermined physical properties, in portions of a hole transporting area and an electron transporting area disposed on opposite sides of a light emitting layer, respectively, thereby reducing leakage of electrons and holes and thus improved in terms of characteristics such as a low driving voltage, high luminous efficiency, and long lifespan.

20 Claims, 1 Drawing Sheet

(51) Int. Cl.
*H10K 50/16* (2023.01)
*H10K 50/17* (2023.01)
*H10K 101/40* (2023.01)

(58) Field of Classification Search
CPC ..... H01L 2251/50–568; H01L 51/5048–5084;
H01L 51/5056–5068; H01L
51/5072–5084; H01L 51/0084–0092;
B32B 2457/206; H10K 50/11; H10K
50/156; H10K 50/166; H10K 50/171;
H10K 2101/40; H10K 2101/10; H10K
2101/30; H10K 50/18; H10K 85/654;
H10K 85/6572; H10K 85/6574; H10K
50/12; H10K 50/13; H10K 50/15; H10K
50/16; H10K 50/17; H10K 2101/00
See application file for complete search history.

(56) References Cited

U.S. PATENT DOCUMENTS

| | | | |
|---|---|---|---|
| 2013/0069073 A1* | 3/2013 | Song | H01L 27/3209 257/40 |
| 2014/0014940 A1 | 1/2014 | Pflumm | |
| 2016/0225992 A1 | 8/2016 | Ito | |
| 2017/0077418 A1 | 3/2017 | Stoessel | |
| 2020/0190113 A1* | 6/2020 | Kim | H01L 51/5056 |
| 2020/0266375 A1* | 8/2020 | Li | H10K 50/18 |

FOREIGN PATENT DOCUMENTS

| | | |
|---|---|---|
| JP | 2017-509164 A | 3/2017 |
| KR | 20040099079 A | 11/2004 |
| KR | 20140093607 A | 7/2014 |
| KR | 20150075674 A | 6/2015 |
| KR | 20160018458 A | 2/2016 |
| TW | 200940512 A | 10/2009 |
| WO | 2007029743 A1 | 3/2007 |
| WO | 2012136295 A1 | 10/2012 |
| WO | 2016105141 A2 | 6/2016 |
| WO | 2017014146 A1 | 1/2017 |

OTHER PUBLICATIONS

Matsushima, Toshinori et al . . . Jan. 10, 2007 vol. 435 pp. 327-330.
JP OA.
TW OA.
International Search Report dated Apr. 1, 2021.
JP Office Action dated Oct. 21, 2022.

* cited by examiner

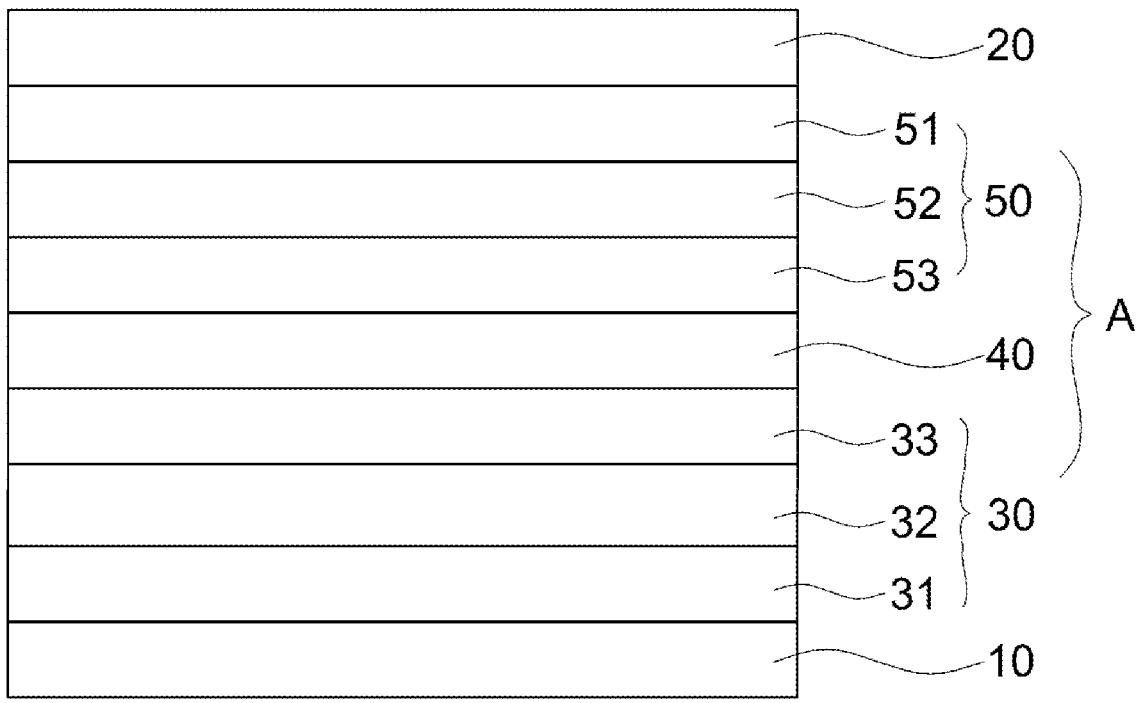

ORGANIC ELECTROLUMINESCENT DEVICE

CROSS-REFERENCE TO RELATED APPLICATION

This application claims priority to and the benefit of Korean Patent Application No. 10-2020-0056397, filed on May 12, 2020, in the Korean Intellectual Property Office (KIPO), the entire content of which is incorporated herein by reference.

TECHNICAL FIELD

The present invention relates to an organic electroluminescent device ("EL device") including an electron-leakage suppression layer E-LSL and a hole-leakage suppression layer H-LSL adjusted to have predetermined physical properties, in portions of a hole transporting area and an electron transporting area disposed on opposite sides of a light emitting layer, respectively, thereby reducing leakage of electrons and holes and thus improved in terms of characteristics such as a low driving voltage, high luminous efficiency, and long lifespan.

DISCUSSION OF RELATED ART

In 1965, studies on organic EL devices led to blue electroluminescence which uses anthracene monocrystals, and in 1987, Tang suggested an organic EL device in a two-layered stack structure which includes a hole layer (NPB) and a light emitting layer ($Alq_3$). Afterwards, in order to realize high efficiency and long life characteristics required for commercialization of organic EL devices, a multilayer stack structure that includes, for example, organic layers responsible for hole injection and transporting, organic layers responsible for electron injection and transporting, and an organic layer responsible for inducing combination of the holes and electrons to cause electroluminescence, each having distinctive and subdivided functions, has been suggested. The introduction of the multilayer stack structure improved the performance of the organic EL devices up to the level of commercialization, and such a multilayer stack structure has been expanding its application range from portable radio display products in 1997 to portable information display devices and TV display devices.

The demand for larger displays and higher resolutions has led to challenges, for example, high efficiency and long lifespan, for the organic EL devices. Particularly, the high resolution that may be realized by forming more pixels in the same area results in a decrease in a light emitting area of an organic EL pixel, thus inevitably reducing the lifespan, which has become one of the most important technical challenges to overcome for the organic EL device.

In the organic EL device, when current or voltage is applied to two electrodes, holes are injected into an organic layer at an anode, and electrons are injected into the organic layer at a cathode. When the injected holes and electrons meet, an exciton is formed, and the exciton falls to the ground state, resulting in light emission. Such organic EL devices may be classified, according to an electron spin type of the formed excitons, into fluorescent EL devices in which singlet excitons contribute to light emission and phosphorescent EL devices in which triplet excitons contribute to light emission.

In terms of the electron spin of the excitons that are formed by recombination of electrons and holes, 25% of singlet excitons and 75% of triplet excitons are produced. In the fluorescent EL devices which emit light by singlet excitons, the internal quantum efficiency may not theoretically exceed 25% depending on the production ratio, and the external quantum efficiency is regarded to have a limitation of 5%. The phosphorescent EL devices which emit light by triplet excitons may improve luminous efficiency by up to four times as compared to fluorescence, when metal complex compounds containing transition metal heavy atoms such as Ir and Pt are used as phosphorescent dopants.

As described above, although the phosphorescent EL devices exhibit higher efficiency than fluorescence in terms of luminous efficiency based on the theoretical fact, in the case of blue phosphorescent devices, except green and red, the development level for phosphorescent dopants having deep blue color purity and high efficiency and hosts having a broad energy gap to satisfy such phosphorescent dopants is insufficient, and thus blue phosphorescent devices have not been commercialized yet, and blue fluorescent devices have been used in products.

In order to improve such characteristics of the organic EL device, research results to increase the stability of the organic EL device by preventing diffusion of holes into an electron transferring layer have been reported. However, to date, no satisfactory result has been obtained.

DETAILED DESCRIPTION OF THE INVENTION

Technical Objectives

The present invention is directed to an organic EL device in which an electron-leakage suppression layer E-LSL and a hole-leakage suppression layer H-LSL adjusted in terms of predetermined physical properties such as a highest occupied molecular orbital ("HOMO") density of states HOMO-DOS and a lowest unoccupied molecular orbital ("LUMO") density of states LUMO-DOS into predetermine ranges are disposed adjacently on opposite sides of a light emitting layer of the organic EL device, thereby achieving high efficiency, low voltage and long lifespan.

Other objects and advantages of the present invention will be more clearly described by the following detailed description and claims.

Technical Solution to the Problem

Aspects of embodiments of the present invention are directed to an organic electroluminescent device including: a structure in which an anode; a hole transporting area; a light emitting layer; an electron transporting area, and a cathode are sequentially stacked, wherein the light emitting layer includes a host, each of the hole transporting area and the electron transporting area includes at least two layers, one of the at least two layers of the hole transporting area contacting the light emitting layer is an electron-leakage suppression layer E-LSL, one of the at least two layers of the electron transporting area contacting the light emitting layer is a hole-leakage suppression layer H-LSL, a density of states of HOMO $DOS_{HOMO}$ and a density of states of LUMO $DOS_{LUMO}$ of each of the electron-leakage suppression layer E-LSL and the hole-leakage suppression layer H-LSL satisfy at least one of the following conditions (i) and (ii):

(i) with respect to the density of states of LUMO, a density of states of LUMO $DOS_{LUMO}^{HOST}$ of the host overlaps the density of states of LUMO $DOS_{LUMO}^{H\text{-}LSL}$ of the hole-leakage suppression layer H-LSL and does not overlap the density of states of LUMO $DOS_{LUMO}^{E\text{-}LSL}$ of the electron-leakage suppression layer E-LSL, and (ii) with respect to the density of states of HOMO, a density of states of HOMO $DOS_{HOMO}^{HOST}$ of the host overlaps the density of states of HOMO $DOS_{HOMO}^{E\text{-}LSL}$ of the electron-leakage suppression layer E-LSL and does not overlap the density of states of HOMO $DOS_{HOMO}^{H\text{-}LSL}$ of the hole-leakage suppression layer H-LSL.

In some embodiments, the densities of states of LUMO $DOS_{LUMO}$ of the electron-leakage suppression layer E-LSL and the hole-leakage suppression layer H-LSL satisfy the condition (i), and, the densities of states of HOMO $DOS_{HOMO}$ of the electron-leakage suppression layer E-LSL and the hole-leakage suppression layer H-LSL satisfy the condition (ii).

In some embodiments, with respect to the density of states of LUMO $DOS_{LUMO}$, an overlap ratio between the density of states of LUMO $DOS_{LUMO}^{HOST}$ of the host and the density of states of LUMO $DOS_{LUMO}^{H\text{-}LSL}$ of the hole-leakage suppression layer H-LSL is more than 0% and 95% or less.

In some embodiments, with respect to the density of states of HOMO $DOS_{HOMO}$, an overlap ratio between the density of states of HOMO $DOS_{HOMO}^{HOST}$ of the host and the density of states of HOMO $DOS_{HOMO}^{E\text{-}LSL}$ of the electron-leakage suppression layer E-LSL is more than 0% and 95% or less.

In some embodiments, with respect to an absolute value of the density of states of LUMO $DOS_{LUMO}$, a difference between a minimum LUMO energy value of the density of states of LUMO $DOS_{LUMO}^{HOST}$ of the host and a maximum LUMO energy value of the density of states of LUMO $DOS_{LUMO}^{E\text{-}LSL}$ of the electron-leakage suppression layer E-LSL that do not overlap each other is more than 0 eV and 2 eV or less.

In some embodiments, with respect to an absolute value of the density of states of HOMO $DOS_{HOMO}$, a difference between a maximum HOMO energy value of the density of states of HOMO $DOS_{HOMO}^{HOST}$ of the host and a minimum HOMO energy value of the density of states of HOMO $DOS_{HOMO}^{H\text{-}LSL}$ of the hole-leakage suppression layer H-LSL that do not overlap each other is more than 0 eV and 2 eV or less.

In some embodiments, the hole transporting area may include at least one of an electron-leakage suppression layer, a hole transporting layer and a hole injection layer.

In some embodiments, with respect to the light emitting layer, the hole transporting area may have a structure in which the electron-leakage suppression layer and the hole injection layer are disposed, or a structure in which the electron-leakage suppression layer, the hole transporting layer, and the hole injection layer are disposed.

In some embodiments, the electron transporting area may include at least one of a hole-leakage suppression layer, an electron transporting layer, and an electron injection layer.

In some embodiments, with respect to the light emitting layer, the electron transporting area may have a structure in which the hole-leakage suppression layer and the electron injection layer are disposed, or a structure in which the hole-leakage suppression layer, the electron transporting layer, and the electron injection layer are disposed.

In some embodiments, an absolute value difference ΔLUMO between a LUMO energy level of the electron-leakage suppression layer E-LSL and a LUMO energy level of the host may be 2.0 eV or less.

In some embodiments, an absolute value difference ΔHOMO between a HOMO energy level of the electron-leakage suppression layer E-LSL and a HOMO energy level of the host may be 2.0 eV or less.

In some embodiments, an absolute value difference ΔLUMO between a LUMO energy level of the hole-leakage suppression layer H-LSL and a LUMO energy level of the host may be 2.0 eV or less.

In some embodiments, an absolute value difference ΔHOMO between a HOMO energy level of the hole-leakage suppression layer H-LSL and a HOMO energy level of the host may be 2.0 eV or less.

In some embodiments, a triplet energy T1 of each of the electron-leakage suppression layer E-LSL and the hole-leakage suppression layer H-LSL may be 1.5 eV or more.

In some embodiments, a singlet energy S1 of each of the electron-leakage suppression layer E-LSL and the hole-leakage suppression layer H-LSL may be 2.0 eV or more.

In some embodiments, an absolute value of a HOMO energy of each of the electron-leakage suppression layer E-LSL and the hole-leakage suppression layer H-LSL may be 4.5 eV or more.

In some embodiments, an absolute value of a LUMO energy of each of the electron-leakage suppression layer E-LSL and the hole-leakage suppression layer H-LSL may be 1.0 eV or more.

In some embodiments, a lowest energy level of bond dissociation energy BDE of each of the electron-leakage suppression layer E-LSL and the hole-leakage suppression layer H-LSL in a ground state may be 1.00 eV or more.

In some embodiments, each of the electron-leakage suppression layer E-LSL and the hole-leakage suppression layer H-LSL may have a refractive index n of 0.6 or more in a blue wavelength area ranging from 400 to 470 nm.

In some embodiments, a dipole moment of each of the electron-leakage suppression layer E-LSL and the hole-leakage suppression layer H-LSL may be more than 0.

In some embodiments, the light emitting layer includes the host and a dopant, and a mixing ratio between the host and the dopant may be 70-99.5:0.5-30 by weight.

In some embodiments, the light emitting layer may include at least one selected from the group consisting of green, red, and blue hosts.

In some embodiments, the organic electroluminescent device may include a plurality of light emitting layer stacks including at least one light emitting layer.

Effects of the Invention

According to one or more embodiments of the present invention, an organic EL device may have high efficiency, low voltage and long lifespan through suppression of electron/hole leakage, by adopting materials adjusted in terms of, for example, a HOMO density of states HOMO-DOS and a LUMO density of states LUMO-DOS to a predetermine range and disposing them adjacently on opposites sides of a light emitting layer.

The effects according to the present invention are not limited by the contents exemplified above, and more various effects are included in the present specification.

BRIEF DESCRIPTION OF DRAWINGS

FIG. 1 is a cross-sectional view illustrating a structure of an organic EL device according to an embodiment of the present invention.

MODES FOR CARRYING OUT THE INVENTION

Advantages and features of the present invention and methods for achieving them will become apparent with reference to the embodiments described below in detail in conjunction with the accompanying drawings. However, the present invention is not limited to the embodiments disclosed below but may be implemented in various different forms, the present embodiments are merely provided to make the disclosure of the present invention complete and to fully convey the scope of the present invention to those of ordinary skill in the art, and the present invention is defined only by the scope of the claims. Thus, in some embodiments, well-known process steps, well-known device structures and well-known techniques are not described in detail in order to avoid obscuring the present invention. Like reference numerals refer to like elements throughout the specification.

Unless otherwise defined, all terms used in the present specification (including technical and scientific terms) may be used with meanings that may be commonly understood by those skilled in the art. In addition, the terms defined in the commonly used dictionaries are not ideally or excessively interpreted, unless they are specifically defined clearly.

In addition, throughout the specification, when a part is said to "include" an element, it means that it may further include another element, not excluding other elements, unless otherwise stated. In addition, throughout the specification, "above" or "on" means not only the case where it is located above or below a target part but also the case where there is another part in the middle thereof and does not necessarily mean the upward direction of gravity. As used herein, the terms "first", "second", and the like are used to distinguish elements from each other, rather than indicating any order or importance.

Throughout this specification, "density of states DOS" may be defined as the number of allowed states at a particular energy level, such as HOMO and LUMO, that electrons are allowed to occupy and a HOMO density of states HOMO-DOS and a LUMO density of states LUMO-DOS of each material may be obtained in the following scheme.

<Organic EL Device>

Hereinafter, preferred embodiments of the organic EL device according to the present invention will be described with reference to the accompanying drawings. However, embodiments of the present invention may be modified in various other forms, and the scope of the present invention is not limited to the embodiments described below.

FIG. 1 is a cross-sectional view schematically illustrating a structure of an organic EL device 100 according to an embodiment of the present invention.

Referring to FIG. 1, the organic EL device 100 includes an anode 10; a cathode 20; a light emitting layer 40 between the anode 10 and the cathode 20; a hole transporting area 30 between the anode 10 and the light emitting layer 40; an electron transporting area 50 between the light emitting layer 40 and the cathode 20, where each of the hole transporting area 30 and the electron transporting area 50 includes at least two layers, an electron-leakage suppression layer E-LSL 33 is disposed at a portion of the hole transporting area 30 contacting the light emitting layer 40, and a hole-leakage suppression layer H-LSL 53 is disposed at a portion of the electron transporting area 50 contacting the light emitting layer 40.

That is, when electrons/holes accumulate in the light emitting layer (e.g., a host), a leakage phenomenon occurs in which the electrons/holes migrate or diffuse to an adjacent layer, thereby adversely affecting the efficiency and lifespan characteristics of the device. Accordingly, in embodiments of the present invention, an electron-leakage suppression layer and a hole-leakage suppression layer are disposed on opposite sides of the light emitting layer as blocking layers that suppress migration of electrons/holes, and their physical properties are controlled within a predetermined range to ensure improvement in efficiency and lifespan of the device.

Specifically, in the organic EL device according to the present invention, an electron-leakage suppression layer E-LSL 33 and a hole-leakage suppression layer H-LSL 53 are disposed on opposite sides of the light emitting layer 40 adjacently thereto, and an overlap (e.g., overlap ratio) of density of states (DOS) of HOMO-LUMO values of the electron-leakage suppression layer E-LSL 33 and the hole-leakage suppression layer H-LSL 53 with density of states (DOS) of HOMO-LUMO values of the host included in the light emitting layer 40 is controlled to a predetermined range. Accordingly, the above-described electron/hole leakage phenomenon may be substantially minimized to increase the efficiency and lifespan characteristics of the device. In particular, DOS in the LUMO state may be a more important factor.

In an embodiment, the density of states of HOMO $DOS_{HOMO}$ and the density of states of LUMO $DOS_{LUMO}$ of the electron-leakage suppression layer E-LSL and the hole-leakage suppression layer H-LSL may satisfy at least one of conditions (i) and (ii) described below.

In an embodiment, (i) with respect to the density of states of LUMO, the density of states of LUMO $DOS_{LUMO}^{HOST}$ of the host and the density of states of LUMO $DOS_{LUMO}^{H-LSL}$ of the hole-leakage suppression layer H-LSL 53 overlap each other, and the density of states of LUMO $DOS_{LUMO}^{HOST}$ of the host and the density of states of LUMO $DOS_{LUMO}^{E-LSL}$ of the electron-leakage suppression layer E-LSL 33 do not overlap each other.

That is, electrons move along a LUMO energy level. From the LUMO-DOS point of view, when the LUMO densities of states of the hole-leakage suppression layer H-LSL 53 and the host overlap each other, rapid electron transferring effect may be provided through the overlap of the LUMO density of states from the hole-leakage suppression layer H-LSL 53 to the host, thereby achieving improvement on efficiency of the organic EL device. In addition, in a case where there is no overlap of the LUMO density of states between the electron-leakage suppression layer E-LSL 33 and the host, phenomena that electrons that have migrated to the light emitting layer are diffused or migrate to, for example, the hole transporting area 30, for example, the electron-leakage suppression layer E-LSL 33 may be suppressed, thereby exhibiting an electron blocking effect. Accordingly, an irreversible decomposition reaction, caused by oxidation which may occur when electrons migrate beyond the light emitting layer 40 to the hole transporting area 30, and a decrease in the lifespan of the organic EL device arising from the irreversible decomposition reaction may be prevented, and thus long lifespan characteristics may be provided.

In another embodiment, (ii) with respect to the density of states of HOMO, the density of states of HOMO $DOS_{HOMO}^{HOST}$ of the host and the density of states of HOMO $DOS_{HOMO}^{E\text{-}LSL}$ of the electron-leakage suppression layer E-LSL 33 overlap each other, and the density of states of HOMO $DOS_{HOMO}^{HOST}$ of the host and the density of states of HOMO $DOS_{HOMO}^{H\text{-}LSL}$ of the hole-leakage suppression layer H-LSL 53 do not overlap each other.

Similarly, holes move along a HOMO energy level. From the HOMO-DOS point of view, when the HOMO densities of states of the electron-leakage suppression layer E-LSL 33 and the host overlap each other, rapid hole transferring effect may be provided through the overlap of the HOMO density of states from the electron-leakage suppression layer E-LSL 33 to the host, thereby achieving improvement on efficiency of the organic EL device. In addition, in a case where there is no overlap of the HOMO density of states between the hole-leakage suppression layer H-LSL 53 and the host, phenomena that holes that have migrated to the light emitting layer are diffused or migrate to, for example, the electron transporting area 50, for example, the hole-leakage suppression layer H-LSL 53 may be suppressed, thereby exhibiting a hole blocking effect.

Accordingly, an irreversible decomposition reaction, caused by oxidation which may occur when electrons migrate beyond the light emitting layer 40 to the hole transporting area 30, and a decrease in the lifespan of the organic EL device arising from the irreversible decomposition reaction may be prevented, and thus long lifespan characteristics may be provided.

In another embodiment, the densities of states of LUMO $DOS_{LUMO}$ of the electron-leakage suppression layer E-LSL 33 and the hole-leakage suppression layer H-LSL 53 may satisfy the aforementioned condition (i), and in addition, the densities of states of HOMO $DOS_{HOMO}$ of the electron-leakage suppression layer E-LSL 33 and the hole-leakage suppression layer H-LSL 53 may satisfy the aforementioned condition (ii) as well.

The above-described effects of preventing electron/hole leakage and improving physical properties of the device such as efficiency and lifespan arising therefrom may provide synergy effects as an overlap ratio of the densities of states (e.g., HOMO DOS, LUMO DOS) between the electron-leakage suppression layer E-LSL 33 and the host; or between the hole-leakage suppression layer H-LSL 53 and the host increases, because it is more advantageous in terms of electron/hole mobility. The overlap ratio of the density of states between the host and the electron-leakage suppression layer E-LSL 33 or between the host and the hole-leakage suppression layer H-LSL 53 is not particularly limited and may be appropriately adjusted in consideration of the above-described physical property improvement effect.

In an embodiment, with respect to the density of states of LUMO $DOS_{LUMO}$, an overlap ratio between the density of states of LUMO $DOS_{LUMO}^{HOST}$ of the host and the density of states of LUMO $DOS_{LUMO}^{H\text{-}LSL}$ of the hole-leakage suppression layer H-LSL 53 may be more than 0%, specifically more than 0% and 95% or less, and more specifically 1 to 85%.

In another embodiment, with respect to the density of states of HOMO $DOS_{HOMO}$, an overlap ratio between the density of states of HOMO $DOS_{HOMO}^{HOST}$ of the host and the density of states of HOMO $DOS_{HOMO}^{E\text{-}LSL}$ of the electron-leakage suppression layer E-LSL 33 may be more than 0%, specifically more than 0% and 95% or less, and more specifically 1 to 85%.

In addition, a non-overlap ratio of the density of states between the host and the electron-leakage suppression layer E-LSL 33 or between the host and the hole-leakage suppression layer H-LSL 53 is not particularly limited and may be appropriately adjusted.

In an embodiment, with respect to an absolute value of the density of states of LUMO $DOS_{LUMO}$, a difference between a minimum LUMO energy value of the density of states of LUMO $DOS_{LUMO}^{HOST}$ of the host and a maximum LUMO energy value of the density of states of LUMO $DOS_{LUMO}^{E\text{-}LSL}$ of the electron-leakage suppression layer E-LSL 33 that do not overlap each other may be more than 0 eV and 2 eV or less.

In another embodiment, with respect to an absolute value of the density of states of HOMO $DOS_{HOMO}$, a difference between a maximum HOMO energy value of the density of states of HOMO $DOS_{HOMO}^{HOST}$ of the host and a minimum HOMO energy value of the density of states of HOMO $DOS_{HOMO}^{H\text{-}LSL}$ of the hole-leakage suppression layer H-LSL 53 that do not overlap each other may be more than 0 eV and 2 eV or less.

Each of the electron-leakage suppression layer E-LSL 33 and the hole-leakage suppression layer H-LSL 53 may have a single-layered structure of one layer or a multilayered structure of two or more layers. If the electron-leakage suppression layer E-LSL 33 and the hole-leakage suppression layer H-LSL 53 have a multilayered structure of two or more layers, it is preferable that one electron-leakage suppression layer E-LSL 33 and/or one hole-leakage suppression layer H-LSL 53 in which density of states (e.g., HOMO DOS, LUMO DOS) is adjusted is disposed to contact the light emitting layer 40 directly.

The electron-leakage suppression layer E-LSL 33 and the hole-leakage suppression layer H-LSL 53 according to the present invention may further satisfy at least one of physical properties described below to achieve a low driving voltage and high efficiency, in addition to the above-described effects of preventing leakage of electrons and holes and improving the mobility of electrons and holes through adjustment of the density of states DOS.

In an embodiment, a singlet energy $S1_{ECL}$ of each of the electron-leakage suppression layer E-LSL 33 and the hole-leakage suppression layer H-LSL 53 may be 2.0 eV or more, specifically 2.0 to 4.5 eV, and more specifically 2.0 to 4.0 eV. In such a case, phenomena that singlet excitons diffuse to an adjacent interface and/or another layer or that luminescence occurs at an interface may be suppressed, and the singlet excitons may be effectively bonded. Accordingly, an amount of excitons is increased, and thus the luminous efficiency of the organic EL device may be improved. As a result, it is possible to prevent spectral mixing of the organic EL device to improve stability, and thus the efficiency and lifespan of the organic EL device may be improved.

In another embodiment, a triplet energy $T1_{ECL}$ of each of the electron-leakage suppression layer E-LSL 33 and the hole-leakage suppression layer H-LSL 53 may be 1.5 eV or more, specifically 1.5 to 4.5 eV, and more specifically 1.5 to 4.0 eV. In such an embodiment, excitons may be prevented from moving to other layers, and thus the efficiency of the organic EL device may be significantly improved.

In another embodiment, an absolute value of a HOMO (Highest Occupied Molecular Orbital) of each of the electron-leakage suppression layer E-LSL 33 and the hole-leakage suppression layer H-LSL 53 may be 4.5 eV or more, specifically 4.5 to 7.0 eV, and more specifically 4.5 to 6.5 eV. With this HOMO energy value, it is possible to block phenomena that holes having transferred to the light emitting layer 40 diffuse or migrate to another electron transporting area, for example, the electron transporting layer 52. Accordingly, it is possible to increase the probability of recombination that holes and electrons meet each other inside the light emitting layer 40, thereby further improving the luminous efficiency of the organic EL device. In addition, the issue of the irreversible decomposition reaction caused by oxidation which may occur when electrons migrate beyond the light emitting layer 40 to the electron transporting layer 52, and the decrease in the lifespan of the organic EL device arising from the irreversible decomposition reaction may be solved, and thus the lifespan characteristics of the device may be improved.

In another embodiment, an absolute value of a LUMO (Lowest Unoccupied Molecular Orbital) of each of the electron-leakage suppression layer E-LSL 33 and the hole-leakage suppression layer H-LSL 53 may be 1.0 eV or more, specifically 1.0 to 3.5 eV, and more specifically 1.0 to 3.0 eV. In addition, a band gap energy of the electron-leakage suppression layer E-LSL 33 and the hole-leakage suppression layer H-LSL 53 may be 2.5 eV or more, and specifically 2.5 to 4.5 eV to effectively provide high-efficiency.

In another embodiment, a lowest energy level of bond dissociation energy BDE of each of the electron-leakage suppression layer E-LSL 33 and the hole-leakage suppression layer H-LSL 53 in a ground state may be 1.00 eV or more, specifically 1.0 to 6.0 eV, and more specifically 1.5 to 6.0 eV. In such an embodiment, the bond dissociation energy BDE may be interpreted as an energy required to break a specific chemical bond. In general, the bond dissociation energy BDE is related to stability of molecules as the bond is stronger, and thus acts as a factor affecting the lifespan.

In another embodiment, an absolute value difference ΔLUMO between the LUMO energy level of the electron-leakage suppression layer E-LSL 33 and the LUMO energy level of the host included in the light emitting layer 40 may be 2.0 eV or less, and specifically, 0 to 2.0 eV.

In another embodiment, an absolute value difference ΔHOMO between the HOMO energy level of the electron-leakage suppression layer E-LSL 33 and the HOMO energy level of the host included in the light emitting layer 40 may be 2.0 eV or less, and specifically, 0 to 2.0 eV.

In another embodiment, an absolute value difference ΔLUMO between the LUMO energy level of the hole-leakage suppression layer H-LSL 53 and the LUMO energy level of the host included in the light emitting layer 40 may be 2.0 eV or less, and specifically, 0 to 2.0 eV.

In another embodiment, an absolute value difference ΔHOMO between the HOMO energy level of the hole-leakage suppression layer H-LSL 53 and the HOMO energy level of the host included in the light emitting layer 40 may be 2.0 eV or less, and specifically, 0 to 2.0 eV.

For example, the LUMO/HOMO energy level of the hole-leakage suppression layer H-LSL 53 according to the present invention may be adjusted so that it is between energy levels of two adjacent organic layers, for example, the light emitting layer 40 and another layer in the electron transporting area 50. For example, the HOMO energy level of the hole-leakage suppression layer H-LSL 53 may be deeper than the HOMO energy level of the light emitting layer 40 and may be the same as or shallower than the HOMO energy level of the adjacent another layer 51 or 52 in the electron transporting area.

In another example, the LUMO/HOMO energy level of the electron-leakage suppression layer E-LSL 33 according to the present invention may be adjusted so that it is between energy levels of two adjacent organic layers, for example, the light emitting layer 40 and another layer in the hole transporting area 30. For example, the LUMO energy level of the electron-leakage suppression layer E-LSL 33 may be deeper than the LUMO energy level of the light emitting layer 40 and may be the same as or shallower than the LUMO energy level of the adjacent another layer 31 or 32 in the hole transporting area.

As described above, when the HOMO/LUMO energy level of the hole-leakage suppression layer H-LSL 53 and/or electron-leakage suppression layer E-LSL 33 is satisfied, HOMO/LUMO energy levels of the organic layers disposed with respect to the light emitting layer 40 adjacently thereto, e.g., the hole transporting area 30 and the electron transporting area 50 may be arranged in a step manner. Accordingly, holes transferred through the anode 10 and electrons transferred through the cathode 20 may be transferred more smoothly to the light emitting layer 40 through the stepwise arrangement of the organic layer A, and thus it is possible to increase the formation of excitons and improve efficiency of the device.

In another embodiment, an electron affinity EA of the hole-leakage suppression layer H-LSL 53 may be at least 0.5 eV or more, and specifically 0.5 to 3.0 eV. In the case where the hole-leakage suppression layer H-LSL 53 has the aforementioned electron affinity, high electron injection efficiency may be obtained.

In another embodiment, in a case where the light emitting layer 40 is a blue light emitting layer containing a blue fluorescent light emitting material, each of the electron-leakage suppression layer E-LSL 33 and the hole-leakage suppression layer H-LSL 53 may have a refractive index n of at least 0.6 or more, and specifically 0.6 to 3.5, in a blue wavelength range of 400 to 470 nm.

If electrons and holes are not balanced due to a difference between the number of holes injected from the anode 10 and the number of electrons injected from the cathode 20, the electrons or holes that fail to form excitons by recombination may be accumulated in the light emitting layer 40. The electrons or holes accumulated in the light emitting layer 40 interfere with smooth oxidation and reduction from occurring in the light emitting layer 40, or affect adjacent layers, and thus the lifespan of the organic EL device may be reduced. On the other hand, each of the electron-leakage suppression layer E-LSL 33 and the hole-leakage suppression layer H-LSL 53 has an electron mobility (p) of at least $1 \times 10^{-8}$ cm$^2$/Vs or more at room temperature, such that the delay of the injection of electrons as compared to the number of holes injected from the anode 10 is prevented, and the injection of electrons into the light emitting layer 40 becomes smooth. Accordingly, efficiency of exciton formation in the light emitting layer 40 is increased, and thus the lifespan of the organic EL device may be improved.

Hereinafter, the configuration of the organic EL device 100 including the above-described electron-leakage suppression layer E-LSL 33 and/or hole-leakage suppression layer H-LSL 53 according to an embodiment of the present invention will be described in more detail.

Anode

In the organic EL device 100 according to the present invention, the anode 10 serves to inject holes into an organic layer A.

A material forming the anode 10 is not particularly limited, and conventional materials known in the art may be used. Non-limiting examples thereof may include metals such as vanadium, chromium, copper, zinc and gold; alloys thereof; metal oxides such as zinc oxide, indium oxide, indium tin oxide (ITO) and indium zinc oxide (IZO); a combination of a metal and an oxide such as ZnO:Al and SnO$_2$:Sb; conductive polymers such as polythiophene, poly (3-methylthiophene), poly[3,4-(ethylene-1,2-dioxy)thiophene](PEDT), polypyrrole and polyaniline, and carbon black.

A method of manufacturing the anode 10 is also not particularly limited and it may be prepared according to conventional methods known in the art. As an example, a method of coating an anode material on a substrate formed of a silicon wafer, quartz, a glass plate, a metal plate or a plastic film may be used.

Cathode

In the organic EL device 100 according to the present invention, the cathode 20 serves to inject electrons into the organic layer A.

A material forming the cathode 20 is not particularly limited, and conventional materials known in the art may be used. Non-limiting examples thereof may include metals such as magnesium, calcium, sodium, potassium, titanium, indium, yttrium, lithium, gadolinium, aluminum, silver, tin, and lead, alloys thereof, and multilayer-structured materials such as LiF/Al and LiO$_2$/Al.

In addition, a method of manufacturing the cathode 20 is not also particularly limited and it may be prepared according to conventional methods known in the art.

Organic Layer

The organic layer A included in the organic EL device according to the present invention may use, without limitation, any conventional configuration used in an organic layer of conventional organic EL devices, and may include, for example, one or more selected from the hole transporting area 30, the light emitting layer 40, and the electron transporting area 50. In such a case, in consideration of the characteristics of the organic EL device, it is preferable to include all the above-mentioned organic layers.

Hole Transporting Area

The hole transporting area 30 included in the organic layer A of the present invention serves to transfer holes injected from the anode 10 to the light emitting layer 40.

The hole transporting area 30 may include two or more layers including at least one of the electron-leakage suppression layer E-LSL 33, the hole injection layer 31 and the hole transporting layer 32 described above.

The hole transporting area 30 may have a structure in which the electron-leakage suppression layer E-LSL 33 and the hole injection layer 31 are disposed with respect to the light emitting layer; or a structure in which the electron-leakage suppression layer E-LSL 33, the hole transporting layer 32, and the hole injection layer 31 are disposed with respect to the light emitting layer. Considering the characteristics of the organic EL device, it is preferable to include all of the electron-leakage suppression layer E-LSL 33, the hole injection layer 31 and the hole transporting layer 32.

The electron-leakage suppression layer E-LSL 33 according to the present invention is not particularly limited in terms of detailed configuration of a compound forming the electron-leakage suppression layer E-LSL 33, such as the type of moiety contained in the compound (e.g., EDG group, EWG group) and its binding position, introduction position of a linker, and its composition, as long as it satisfies the above-described density of states (e.g., HOMO DOS, LUMO DOS) overlap parameters and corresponding values.

In an embodiment, a compound that may be used as a material for the electron-leakage suppression layer E-LSL 33 may be represented by the following Formula 1.

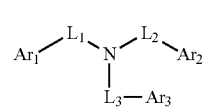

[Formula 1]

In Formula 1, $L_1$ to $L_3$ may be the same as or different from each other, each independently being a single bond or selected from the group consisting of a $C_4$ to $C_{60}$ arylene group and a $C_4$ to $C_{60}$ heteroarylene group, $Ar_1$ to $Ar_3$ may be the same as or different from each other, each independently being selected from the group consisting of hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group, and a $C_6$ to $C_{60}$ arylamine group, the arylene group and the heteroarylene group of $L_1$ to $L_3$; and the alkyl group, the alkenyl group, the alkynyl group, the aryl group, the heteroaryl group, the aryloxy group, the alkyloxy group, the cycloalkyl group, the heterocycloalkyl group, the arylsilyl group, the alkylsilyl group, the alkylboron group, the arylboron group, the arylphosphine group, the arylphosphine oxide group and the arylamine group of $Ar_1$ to $Ar_3$ may each independently be substituted with one or more kinds of substituents selected from the group consisting of hydrogen, deuterium, halogen, a cyano group, a nitro group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other.

The compound that may be used as a material for the electron-leakage suppression layer E-LSL 33 of the present invention described above may be further embodied as exemplary compounds to be described below. However, the compound constituting the electron-leakage suppression layer E-LSL 33 according to the present invention is not limited by those illustrated below. Particularly, if physical properties such as an overlap of density of states (e.g., HOMO DOS, LUMO DOS) are satisfied, the type of moiety (e.g., EDG group, EWG group) included in the compound and its binding position, and an introduction position of a linker are not particularly limited. In addition, compounds having various modifications in their chemical structures belong to the scope of the present invention.

The electron-leakage suppression layer E-LSL 33 according to the present invention may be manufactured through conventional methods known in the art. Examples thereof may include, but not limited to, a vacuum deposition method, spin coating method, cast method, LB (Langmuir-Blodgett), inkjet printing method, laser printing method, LITI (Laser Induced Thermal Imaging) and the like.

In the hole transporting area 30 according to the present invention, materials for the hole injection layer 31 and/or the hole transporting layer 32, used together with the electron-leakage suppression layer E-LSL 33, are not particularly limited, and any hole injection/transporting layer material known in the art may be used without limitation, as long as it has a low hole injection barrier and a high hole mobility. In such a case, the materials forming the hole injection layer 31 and the hole transporting layer 32 may be the same as or different from each other.

The hole injection material may use, without limitation, any hole injection material known in the art. Non-limiting examples of the hole injection material may include phthalocyanine compounds such as copper phthalocyanine; DNTPD (N,N'-diphenyl-N,N'-bis-[4-(phenyl-m-tolylamino)-phenyl]-biphenyl-4,4'-diamine), m-MTDATA (4,4', 4"-tris (3-methylphenylphenylamino)triphenylamine), TDATA (4,4'4"-Tris(N,N-diphenylamino)triphenylamine), 2TNATA (4,4',4"-tris{N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonic acid), PANI/PSS (polyaniline)/poly(4-styrenesulfonate)), and the like, which may be used solely or as a mixture of two or more thereof.

The hole transporting material may use, without limitation, any hole transporting material known in the art. Non-limiting examples of the hole transporting material may include carbazole-based derivatives such as phenylcarbazole, polyvinylcarbazole or the like; fluorine-based derivatives; triphenylamine-based derivatives such as TPD (N,N'-bis(3-methylphenyl)-N,N'-diphenyl-[1,1-biphenyl]-4,4'-diamine), TCTA (4,4',4"-tris(N-carbazolyl)triphenylamine) or the like; NPB (N,N'-di(1-naphthyl)-N,N'-diphenylbenzidine), TAPC(4,4'-cyclohexylidene bis[N,N-bis(4-methylphenyl)benzenamine]), and the like, which may be used solely or as a mixture of two or more thereof.

The hole transporting area 30 may be formed through any conventional method known in the art. Examples of the method may include, but are not limited to, a vacuum deposition method, a spin coating method, a cast method, a Langmuir-Blodgett (LB) method, an inkjet printing method, a laser printing method, a laser-induced thermal imaging (LITI) method, and the like.

Light Emitting Layer

The light emitting layer 40 included in the organic layer A of the present invention is a layer in which holes and electrons meet each other forming excitons, and a color of light emitted by the organic EL device may vary according to the material forming the light emitting layer 40.

Such a light emitting layer 40 may include a host and a dopant, and a mixing ratio thereof may be appropriately adjusted within a range known in the art. For example, the light emitting layer 40 may include the host in an amount ranging from 70 to 99.9 percent by weight (hereinafter, "wt %") and the dopant in an amount ranging from 0.1 to 30 wt %, with respect to the total weight of the light emitting layer 40. More specifically, when the light emitting layer 40 is blue fluorescence, green fluorescence, or red fluorescence, the host may be included in an amount ranging from 80 to 99.9 wt %, and the dopant may be included in an amount ranging from 0.1 to 20 wt %. In addition, when the light emitting layer 40 is blue fluorescence, green fluorescence or red phosphorescence, the host may be included in an amount ranging from 70 to 99 wt % and the dopant may be included in an amount ranging from 1 to 30 wt %.

Any host known in the art may be included in the light emitting layer 40 of the present invention without particular limitation, and non-limiting examples thereof may include alkali metal complex compounds, alkaline earth metal complex compounds, or fused aromatic cyclic derivatives.

More specifically, the host material is preferably aluminum complex compounds, beryllium complex compounds, anthracene derivatives, pyrene derivatives, triphenylene derivatives, carbazole derivatives, dibenzofuran derivatives, dibenzothiophene derivatives, or a combination of one or more kinds thereof that may enhance luminous efficiency and lifespan of the organic EL device.

In addition, any dopant known in the art may be included in the light emitting layer 40 of the present invention without particular limitation, and non-limiting examples thereof may include anthracene derivatives, pyrene derivatives, arylamine derivatives, and metal complex compounds including iridium (Ir) or platinum (Pt).

Such dopants may be classified into red dopants, green dopants, and blue dopants, and any conventional red dopants, green dopants, and blue dopants that are known in the art may be used without particular limitation.

More specifically, non-limiting examples of the red dopant may include PtOEP (Pt(II) octaethylporphyrin), Ir(piq)$_3$ (tris(2-phenylisoquinoline) iridium), Btp$_2$Ir (acac) (bis (2-(2'-benzothienyl)-pyridinato-N,C3') iridium(acetylacetonate)), or a mixture of two or more thereof.

Furthermore, non-limiting examples of the green dopant may include Ir(ppy)$_3$ (tris(2-phenylpyridine) iridium), Ir(ppy)$_2$(acac) (bis(2-phenylpyridine) (acetylacetonato) iridium(III)), Ir(mppy)$_3$ (tris(2-(4-tolyl)phenylpiridine) iridium), C545T (10-(2-benzothiazolyl)-1,1,7,7-tetramethyl-2,3,6,7-tetrahydro-1H,5H,11H-[1]benzopyrano[6,7,8-ij]-quinolizin-11-one), or a mixture of two or more thereof.

Furthermore, non-limiting examples of the blue dopant may include F$_2$Irpic (bis[3,5-difluoro-2-(2-pyridyl)phenyl] (picolinato) iridium(III)), (F$_2$ppy)$_2$Ir(tmd), Ir(dfppz)$_3$, DPVBi (4,4'-bis(2,2'-diphenylethen-1-yl)biphenyl), DPAVBi (4,4'-bis[4-(diphenylamino) styryl]biphenyl), TBPe (2,5,8,11-tetra-tert-butylperylene), or a mixture of two or more thereof.

The light emitting layer 40 according to the present invention may be a red light emitting layer including a red phosphorescent material, a green light emitting layer including a green phosphorescent material; or a blue light emitting layer including a blue phosphorescent material or a blue fluorescent material. The light emitting layer 40 may preferably be a light emitting layer including a blue fluorescent material.

The light emitting layer 40 may include a single layer including one type of material, a single layer including a plurality of different materials, or a multi-layer of at least two layers, each including different materials from each other. When the light emitting layer 40 includes a plurality of layers, the organic EL device may emit light having various colors. Specifically, the present invention may provide an organic EL device having mixed colors by including a plurality of light emitting layers, including different kinds of materials, in series. In addition, when the light emitting layer 40 includes a plurality of light emitting layers, the driving voltage of the device may increase, while the current value in the organic EL device become constant, and thus the organic EL device may have luminous efficiency that is improved by the number of the light emitting layers.

Although not illustrated in the drawings, the organic EL device 100 may include a plurality of light emission stacks (not illustrated) including at least one light emitting layer.

The plurality of light emitting layers included in the light emission stack may be light emitting layers that emit light of different colors, or light emitting layers that emit light of the same color. That is, the emission color may vary depending on the material forming the light emitting layer. For example, the plurality of light emission stacks may include a material emitting blue, green, red, yellow, white, or the like, and may be formed using phosphorescent or fluorescent materials. In this case, the colors represented by the light emitting layers may be complementary to each other. In addition, a color may be selected as a combination of colors capable of emitting white light. Each of the light emitting layers may include phosphorescent dopants or fluorescent dopants corresponding to the selected color, respectively.

Although not illustrated in the drawings, the organic EL device 100 may further include a charge generation layer CGL (not illustrated) disposed between adjacent stacks of the plurality of light emission stacks and connecting them.

The charge generation layer CGL means a layer, in the organic EL device including a plurality of light emission stacks, that separates light emission stacks adjacent to each other without directly contacting both electrodes (e.g., anode and cathode). Such a charge generation layer CGL is disposed between two adjacent light emission stacks, generating electrons to serve as a cathode for one light emission stack, and generating holes to serve as an anode for another light emission stack. The charge generation layer CGL may use, without limitation, any material that may be used as a charge generation layer material known in the art. In addition, a conventional n-type and/or p-type material known in the art may be doped to the above material for the charge generation layer.

Electron Transporting Area

In the organic EL device 100 according to the present invention, the electron transporting area 50 included in the organic layer A serves to transfer electrons injected from the cathode 20 to the light emitting layer 40.

The electron transporting area 50 may include two or more layers including the hole-leakage suppression layer H-LSL 53; and at least one of the electron transporting layer 52 and the electron injection layer 51, and may further include an electron transporting auxiliary layer (not illustrated) if necessary.

The electron transporting area 50 may have a structure in which the hole-leakage suppression layer H-LSL 53 and the electron injection layer 51 are disposed with respect to the light emitting layer or a structure in which the hole-leakage suppression layer H-LSL 53, the electron transporting layer 52, and the electron injection layer 51 are disposed with respect to the light emitting layer. Considering characteristics of the organic EL device, it is preferable to include all of the hole-leakage suppression layer H-LSL 53, the electron injection layer 51 and the electron transporting layer 52.

The hole-leakage suppression layer H-LSL 53 according to the present invention is not particularly limited in terms of detailed configuration of a compound forming the hole-leakage suppression layer H-LSL 53, such as the type of moiety contained in the compound (e.g., EDG group, EWG group) and its binding position, introduction position of a linker, and its composition, as long as it satisfies the above-described density of states (e.g., HOMO DOS, LUMO DOS) overlap parameters and corresponding values.

In an embodiment, the compound included as a material for the hole-leakage suppression layer H-LSL 53 may be a compound bonded with at least one moiety, known in the art, having EWG characteristics with high electron absorptivity, and may be, for example, a bipolar compound including both of a moiety having EWG characteristics with high electron absorptivity and a moiety having EDG characteristics with high electron donating properties.

More specifically, the compound (material) forming the hole-leakage suppression layer H-LSL 53 may include at least one EWG moiety including at least one of a 6-membered moiety represented by the following Formula 2; a 5-membered moiety represented by the following Formula 3; and a polycyclic moiety in which the 6-membered moiety and the 5-membered moiety are fused.

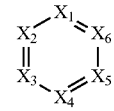

[Formula 2]

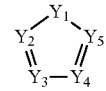

[Formula 3]

In Formula 2 or 3, $X_1$ to $X_6$ and $Y_1$ to $Y_5$ may be the same as or different from each other, each independently being N or C(R), while at least one of $X_1$ to $X_6$ and $Y_1$ to $Y_5$ is N, when C(R) is plural in number, the plurality of R may be the same as or different from each other, each independently being selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, or may be bonded with an adjacent group to form a fused ring, the alkyl group, the alkenyl group, the alkynyl group, the aryl group, the heteroaryl group, the aryloxy group, the alkyloxy group, the cycloalkyl group, the heterocycloalkyl group, the arylamine group, the alkylsilyl group, the alkylboron group, the arylboron group, the arylphosphine group, the arylphosphine oxide group, and the arylamine group of R may each independently be substituted with one or more kinds of substituents selected from the group consisting of hydrogen, deuterium (D), halogen, a cyano group, a nitro group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents may be the same as or different from each other.

The compound (material) forming the hole-leakage suppression layer H-LSL 53 exhibits excellent electronic properties by including at least one nitrogen (N)-containing heteroaromatic ring containing nitrogen (N), that is, an EWG (electron withdrawing group). Accordingly, when the compound having the 6-membered or 5-membered moiety represented by Chemical Formula 2 or 3, or having a polycyclic moiety in which they are fused is used as a material for the hole-leakage suppression layer H-LSL 53, the hole-leakage suppression layer H-LSL 53 may well receive electrons from the cathode 20 to transfer the electrons to the light emitting layer 40 smoothly, and accordingly, the driving voltage of the device 100 may be reduced and high efficiency and long life of the device 100 may be resulted.

In addition, the material of the hole-leakage suppression layer H-LSL 53 not only has a high triplet energy, but also has a molecular weight of the compound significantly increased through the control of various types of substituents introduced into a mother nucleus and location of the introduction, and thus an improved glass transition degree and high thermal stability may be achieved. In addition, since it is also effective in suppressing crystallization of the organic layer, the organic EL device 100 including the hole-leakage suppression layer H-LSL 53 may greatly improve durability and lifespan characteristics.

According to an embodiment of the present invention, the EWG moiety included in the compound forming the hole-leakage suppression layer H-LSL 53 may be embodied as, but not limited to, any one selected from the following structural group.

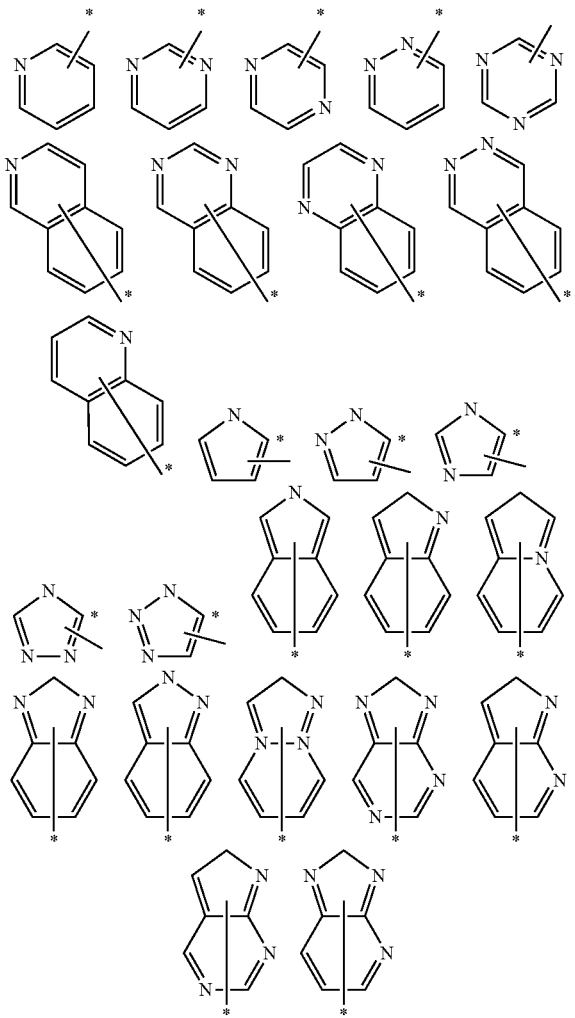

In the above formulas,
* means a site where a bond is made with a compound that forms a hole-leakage suppression layer.

Although not specifically indicated in the above structural formulas, at least one or more substituents (e.g., the same as the definition of R) known in the art may be substituted. In addition, although one site * connected to the compound forming the hole-leakage suppression layer H-LSL 53 is shown in the structural formula, it will be understood that a case where two sites are included is within the scope of the present invention.

In an embodiment according to the present invention, the compound forming the hole-leakage suppression layer H-LSL 53 may include at least one conventional EDG moiety known in the pertinent art, other than the aforementioned EWG, that has higher electron donating properties than that of the EWG.

The compound that may be used as the material forming the hole-leakage suppression layer H-LSL 53 of the present invention may be further embodied as exemplary compounds described below. However, the compound forming the hole-leakage suppression layer H-LSL 53 according to the present invention is not limited by those illustrated below. In particular, as long as the physical properties such as DOS overlap ratio are satisfied, the type of moieties (e.g., EDG group and EWG group) included in the compound, its binding site, and the linking position of the linker are not particularly limited, and the compound with various modified structures are also within the scope of the present invention.

The hole-leakage suppression layer H-LSL 53 according to the present invention may be formed using any conventional method known in the art without particular limitation, for example, a vacuum deposition method, a spin coating method, a cast method, a Langmuir-Blodgett (LB) method, an inkjet printing method, a laser printing method, a laser-induced thermal imaging (LITI) method, and the like.

In the electron transporting area 50 according to the present invention, materials for the electron transporting layer 52 and the electron injection layer 51, used together with the hole-leakage suppression layer H-LSL 53, are not particularly limited, and any electron injection/transporting layer material known in the art may be used without limitation, as long as it facilitates electron injection and has a high electron mobility. In such a case, the materials forming the electron transporting layer 52 and the electron injection layer 51 may be the same as or different from each other.

Non-limiting examples of electron injection materials that may be used include anthracene derivatives, heteroaromatic compounds, alkali metal complexes, and the like. Specifically, examples thereof may include lanthanum group metals such as LiF, $Li_2O$, BaO, NaCl, CsF, Yb and the like; or a metal halide such as RbCl, RbI, or the like, which may be used solely or in combination of two or more thereof.

In addition, the electron transporting layer 52 may use a material having conventional electron transporting characteristics known in the art without limitation. For example, oxadiazole derivatives, triazole derivatives, phenanthroline derivatives (e.g., BCP), heterocyclic derivatives including nitrogen, and the like may be included.

The electron transporting area 50 according to the present invention, specifically, the electron injection layer 52 and the electron transporting layer 52 may use a material co-deposited with an n-type dopant so that electrons may be easily injected from the cathode. In such a case, an alkali metal complex known in the art may be used as the n-type dopant without limitation, and examples thereof may include an alkali metal, an alkaline earth metal, or a rare earth metal.

The electron transporting area 50 may be manufactured through conventional methods known in the art. Examples thereof may include a vacuum deposition method, spin coating method, cast method, LB (Langmuir-Blodgett), inkjet printing method, laser printing method, LITI (Laser Induced Thermal Imaging) and the like, but are not limited thereto.

Auxiliary Light Emitting Layer

Optionally, the organic EL device 100 according to the present invention may further include an auxiliary light emitting layer (not illustrated) disposed between the hole transporting area 30 and the light emitting layer 40.

The auxiliary light emitting layer serves to transfer holes migrating from the hole transporting area 30 to the light emitting layer 40 and to control a thickness of the organic layer A. The auxiliary light emitting layer has a high LUMO value to prevent electrons from moving to the hole transporting layer 32 and has a high triplet energy to prevent the excitons of the light emitting layer 40 from diffusing into the hole transporting layer 32.

The auxiliary light emitting layer may include a hole transporting material and may include a material the same as a material for the hole transporting area. In addition, the auxiliary light emitting layers of the red, green, and blue organic EL devices may be formed of the same material.

The material of the auxiliary light emitting layer is not particularly limited, and examples thereof may include carbazole derivatives and arylamine derivatives. Non-limiting examples of the auxiliary light emitting layer that are applicable may include NPD (N, N-dinaphthyl-N, N'-diphenyl benzidine), TPD (N, N'-bis-(3-methylphenyl)-N, N'-bis(phenyl)-benzidine), s-TAD, and MTDATA(4,4',4-Tris(N-3-methylphenyl-Nphenyl-amino)-triphenylamine). They may be used solely or in combination of two or more thereof. In addition, the auxiliary light emitting layer may include a p-type dopant, in addition to the above materials. As the p-type dopant, any well-known p-type dopant used in the art may be used.

Capping Layer

Optionally, the organic EL device 100 of the present invention may further include a capping layer (not illustrated) disposed on the cathode 20 described above. The capping layer serves to protect the organic EL device and to help light emitted from the organic layer to be efficiently emitted to the outside.

The capping layer may include at least one selected from the group consisting of tris-8-hydroxyquinoline aluminum (Alq$_3$), ZnSe, 2,5-bis(6'-(2',2"-bipyridyl))-1,1-dimethyl-3,4-diphenylsilole, 4'-bis [N-(1-napthyl)-N-phenyl-amion] biphenyl (α-NPD), N,N'-diphenyl-N,N'-bis (3-methylphenyl)-1,1'-biphenyl-4,4'-diamine (TPD), and 1,1'-bis(di-4-tolylaminophenyl) cyclohexane (TAPC). A material forming such a capping layer is less expensive than materials of other layers of the organic EL device.

The capping layer may be a single layer, or may include two or more layers having different refractive indices so that the refractive index gradually changes along the two or more layers.

The capping layer may be manufactured by a conventional method known in the art, and for example, various methods such as vacuum deposition, spin coating, casting, or Langmuir-Blodgett (LB) method may be used.

The organic EL device of the present invention including the above-described configuration may be manufactured according to conventional methods known in the art. For example, the organic EL device may be manufactured by vacuum depositing an anode material on a substrate and then vacuum depositing a material of the hole transporting area, a material of the light emitting layer, a material of the electron transporting area, and a material of the cathode on the anode in the order.

Meanwhile, a structure in which the hole transporting area 30 and the electron transporting area 50 are disposed on opposite sides of the light emitting layer 40, where the electron-leakage suppression layer E-LSL 33, the hole transporting layer 32 and the hole injection layer 31 are disposed at the hole transporting area 30 and the hole-leakage suppression layer H-LSL 53, the electron transporting layer 52 and the electron injection layer 51 are disposed at the electron transporting area 50 is described in FIG. 1 by way of example. However, the present invention is not limited to the above-described configuration, and various modifications are possible. For example, a structure in which the hole transporting area 30 includes the electron-leakage suppression layer E-LSL 33 and one layer 31 or 32, a structure in which the electron transporting area 50 includes the hole leakage suppression layer H-LSL 53 and one layer 51 or 52, or a structure in which the hole transporting area 30 includes the electron-leakage suppression layer E-LSL 33 and one layer 31 or 32 and the electron transporting area 50 includes the hole leakage suppression layer H-LSL 53 and one layer 51 or 52 is also within the scope of the present invention.

The organic EL device 100 according to the present invention has a structure in which the anode 10, the organic layer A, and the cathode 20 are sequentially stacked, and an insulating layer or an adhesive layer may be further included between the anode 10 and the organic layer A or between the cathode 20 and the organic layer A. Such an organic EL device of the present invention may have excellent lifespan characteristics since the lifetime (e.g., half-time) of the initial brightness is increased while maintaining the maximum luminous efficiency when voltage, current, or both are applied.

Hereinafter, the present invention will be described in detail with reference to embodiments, but the following embodiments are merely illustrative of the present invention, and the present invention is not limited by the following embodiments.

Preparation Example

The compounds according to the present invention were prepared as follows, and their physical properties were measured by methods known in the art, respectively, which are shown in Table 1 below.

The HOMO energy, the LUMO energy, the singlet energy S1, the triplet energy T1 and the like of the material used in the present invention were calculated using a Schrödinger program (Schrödinger software release 2020-1). Specifically, the basic calculation scheme of each property used the B3LYP functional (Becke, 3-parameter, Lee-Yang-Parr) which is most widely used among density functional theories (DFT), and triple zeta (TZV) was used as a basis set to optimize the molecular structure.

The HOMO energy and the LUMO energy of each compound were calculated in the ground state S0 with the optimized structure, and each of the singlet energy S1 and the triplet energy T1 was calculated based on the optimized energy difference between the ground state S0/singlet energy S1 and ground state S0/triplet energy T1.

In addition, the DOS (density of states) was obtained using molecular dynamics and quantum mechanics. For example, firstly, a simulation of hundreds to thousands of atoms was conducted through molecular dynamics, the HOMO and LUMO energies of all the molecules were then obtained using the quantum mechanics, and the DOS was then obtained based on them. The materials for the electron-leakage suppression layer E-LSL and the hole-leakage suppression layer H-LSL were compared with the host materials mixed together, and a DOS overlap ratio was percentaged.

In addition, a bond dissociation energy (BDE), a refractive index, and a dipole moment were obtained using the aforementioned B3LYP/TZV method, and in particular, for the BDE, an energy required to break a certain chemical bond in a molecule is calculated, and a value having a smallest BDE was selected.

TABLE 1

| Color | Compound | HOMO (eV) | LUMO (eV) | Host overlap ratio (%) HOMO | Host overlap ratio (%) LUMO | S1 energy (eV) | T1 energy (eV) | Refractive index (450 nm) | BDE (eV) | Dipole moment (Debye) |
|---|---|---|---|---|---|---|---|---|---|---|
| Blue | 1 H-LSL-1 | −6.09 | −2.1 | 0 | 45 | 3.65 | 2.62 | 1.85 | 2.43 | 2.52 |
| | E-LSL-1 | −5.23 | −1.37 | 38 | 0 | 3.23 | 2.47 | 1.72 | 1.53 | 0.13 |
| | 2 H-LSL-2 | −6.39 | −2.29 | 0 | 0 | 3.68 | 2.68 | 2.12 | 1.22 | 2.08 |
| | E-LSL-2 | −5.26 | −1.5 | 47 | 0 | 3.02 | 2.43 | 1.12 | 2.03 | 1.16 |
| | 3 H-LSL-3 | −6.05 | −1.99 | 0 | 71 | 3.68 | 2.6 | 1.22 | 2.66 | 7.89 |
| | E-LSL-3 | −5.33 | −1.73 | 62 | 0 | 3.04 | 2.3 | 1.62 | 1.74 | 0.82 |
| | 4 H-LSL-4 | −5.81 | −2.05 | 0 | 67 | 3.43 | 2.33 | 1.81 | 3.01 | 3.38 |
| | E-LSL-4 | −5.11 | −1.69 | 0 | 0 | 3.03 | 2.39 | 1.88 | 2.54 | 1.67 |
| | 5 H-LSL-5 | −6.26 | −2.29 | 0 | 28 | 3.27 | 2.70 | 2.07 | 1.98 | 3.04 |
| | E-LSL-5 | −5.31 | −1.78 | 58 | 0 | 3.03 | 2.4 | 0.98 | 1.71 | 1.28 |
| Green | 6 H-LSL-6 | −6.11 | −2.51 | 0 | 74 | 3.14 | 2.43 | 1.58 | 3.25 | 5.73 |
| | E-LSL-6 | −5.32 | −1.42 | 53 | 0 | 3.39 | 2.6 | 1.71 | 2.25 | 1.85 |
| | 7 H-LSL-7 | −6.04 | −2.15 | 0 | 0 | 3.8 | 2.43 | 1.97 | 3.02 | 6.97 |
| | E-LSL-7 | −5.27 | −1.33 | 23 | 0 | 3.34 | 2.51 | 2.11 | 2.07 | 1.69 |
| | 8 H-LSL-8 | −6.23 | −2.52 | 0 | 62 | 3.68 | 2.98 | 1.89 | 2.33 | 0.25 |
| | E-LSL-8 | −5.31 | −1.71 | 45 | 0 | 3.22 | 2.50 | 1.93 | 2.16 | 0.68 |
| | 9 H-LSL-9 | −6.3 | −2.47 | 0 | 63 | 3.66 | 2.60 | 2.23 | 3.41 | 7.15 |
| | E-LSL-9 | −5.12 | −1.62 | 0 | 0 | 3.19 | 2.51 | 1.69 | 1.64 | 0.61 |
| | 10 H-LSL-10 | −5.95 | −2.58 | 0 | 57 | 3.22 | 2.6 | 1.77 | 2.03 | 9.45 |
| | E-LSL-10 | −5.27 | −1.42 | 35 | 0 | 3.39 | 2.56 | 1.94 | 2.17 | 3.32 |
| Red | 11 H-LSL-11 | −6.30 | −2.32 | 0 | 65 | 3.69 | 2.59 | 2.09 | 3.41 | 3.65 |
| | E-LSL-11 | −5.19 | −1.35 | 42 | 0 | 3.78 | 2.69 | 2.21 | 2.27 | 9.51 |
| | 12 H-LSL-12 | −6.13 | −2.68 | 0 | 0 | 3.53 | 2.6 | 1.87 | 2.79 | 3.92 |
| | E-LSL-12 | −5.20 | −1.74 | 54 | 0 | 3.54 | 2.84 | 2.03 | 1.86 | 3.96 |
| | 13 H-LSL-13 | −6.28 | −2.20 | 0 | 72 | 3.66 | 2.94 | 1.92 | 2.52 | 2.45 |
| | E-LSL-13 | −5.23 | −1.31 | 57 | 0 | 3.21 | 2.87 | 1.95 | 3.59 | 4.59 |
| | 14 H-LSL-14 | −5.87 | −2.38 | 0 | 58 | 3.31 | 2.69 | 2.08 | 1.84 | 0.57 |
| | E-LSL-14 | −5.11 | −1.59 | 0 | 0 | 3.88 | 2.78 | 1.87 | 4.12 | 5.91 |
| | 15 H-LSL-15 | −5.93 | −2.39 | 0 | 62 | 3.07 | 2.63 | 1.96 | 2.39 | 4.19 |
| | E-LSL-15 | −5.29 | −1.37 | 58 | 0 | 3.69 | 2.62 | 1.93 | 2.11 | 7.33 |
| | E-LSL (Compound A) | −5.00 | −1.25 | 0 | 0 | 3.23 | 2.50 | 2.76 | 2.96 | 0.01 |
| | H-LSL (Compound B) | −6.03 | −1.53 | 0 | 0 | 3.86 | 2.75 | 1.91 | 3.05 | 2.04 |
| | Blue-Host (NNA) | −5.45 | −1.95 | — | — | 3.21 | 1.78 | 1.78 | 4.52 | 0.17 |
| | Green-Host (DPDDC) | −5.55 | −2.43 | — | — | 2.69 | 2.75 | 1.98 | 4.12 | 2.84 |
| | Red-Host (BBCQ) | −5.49 | −2.24 | — | — | 2.78 | 2.25 | 1.86 | 3.72 | 3.70 |

In such a case, structures of respective compounds used in Table 1 of the present invention are as follows.

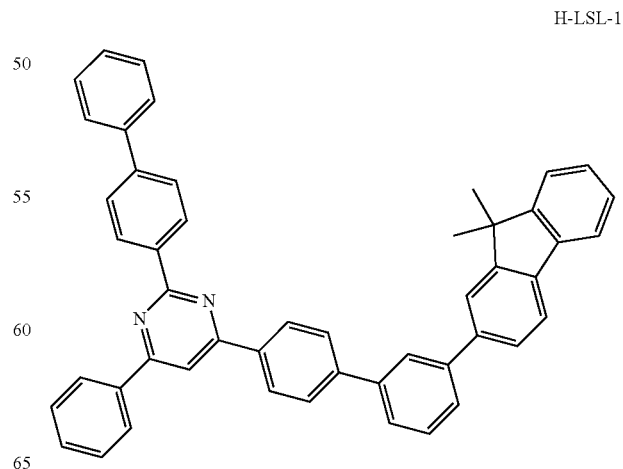

H-LSL-1

H-LSL-2
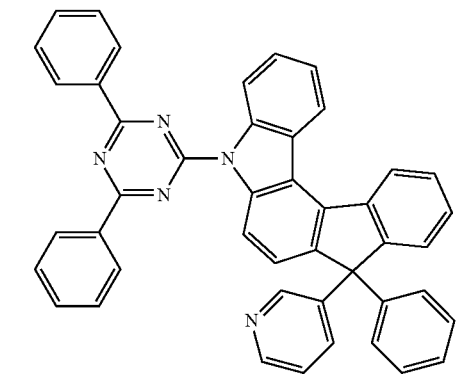
H-LSL-6
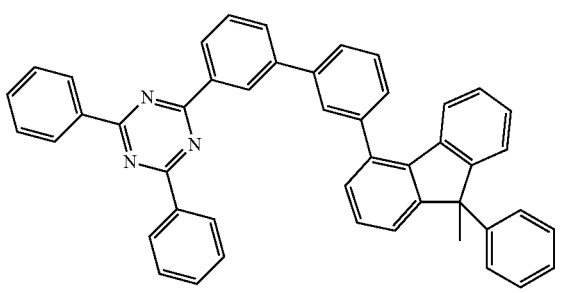
H-LSL-3
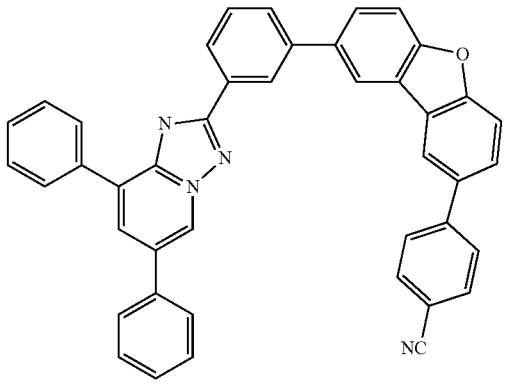
H-LSL-7
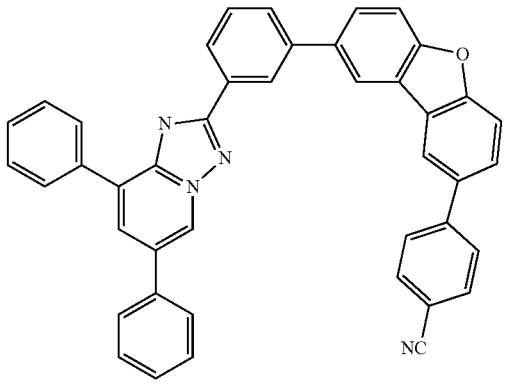
H-LSL-4
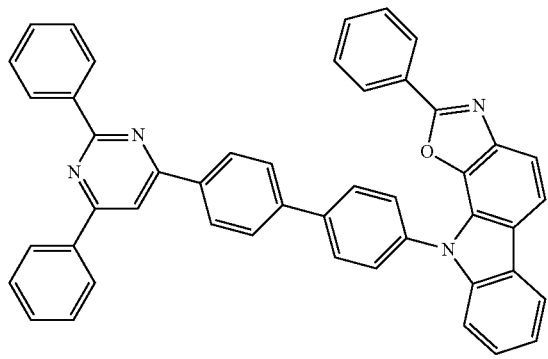
H-LSL-8
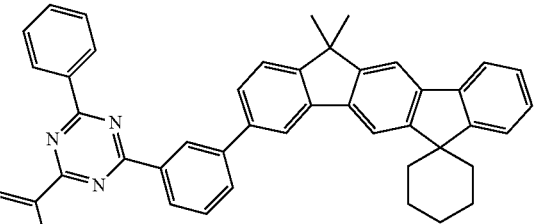
H-LSL-9
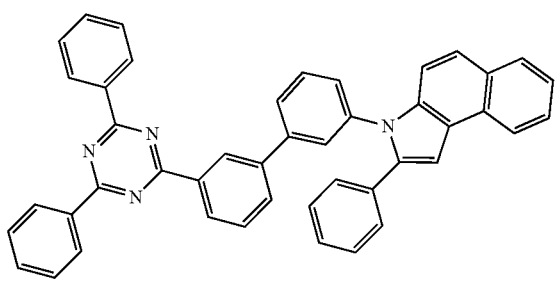
H-LSL-5
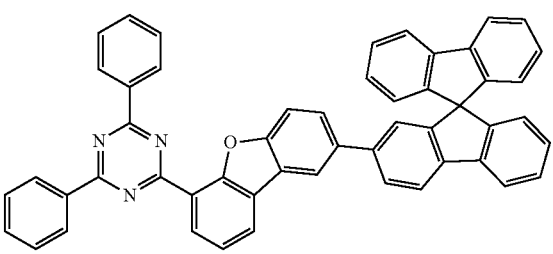
H-LSL-10
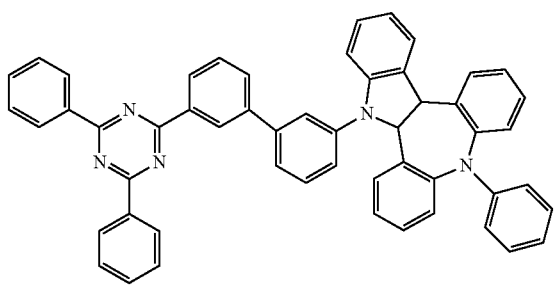

H-LSL-11
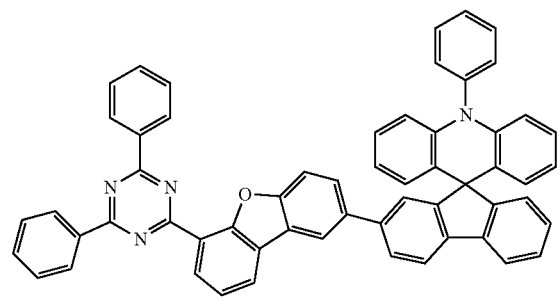
H-LSL-12
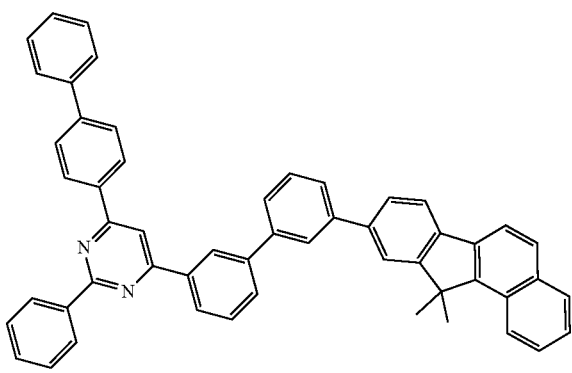
H-LSL-13
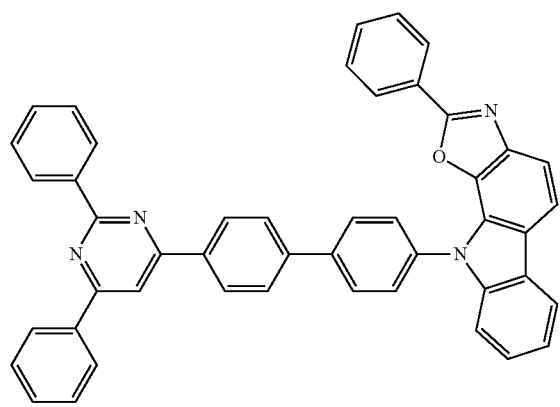
H-LSL-14
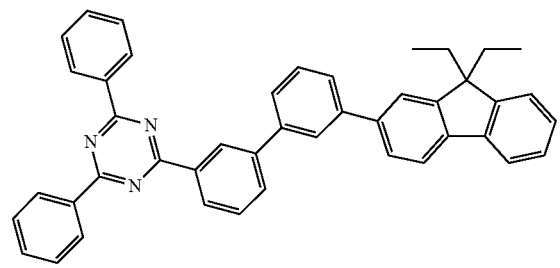
H-LSL-15
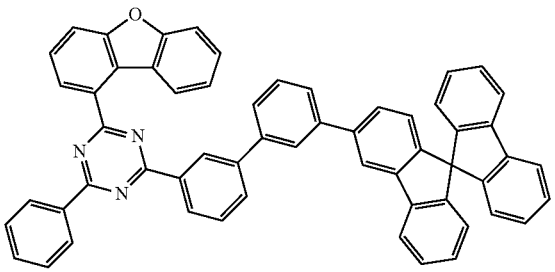
E-LSL-1
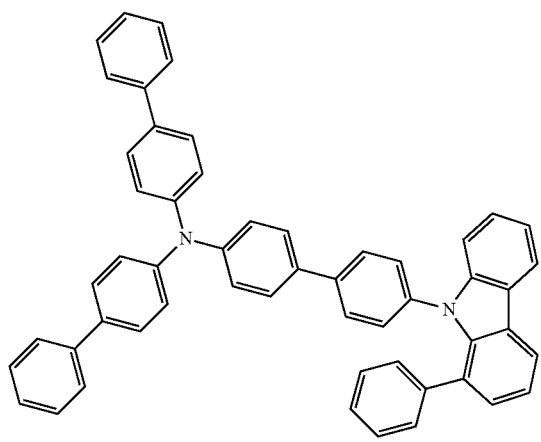
E-LSL-2
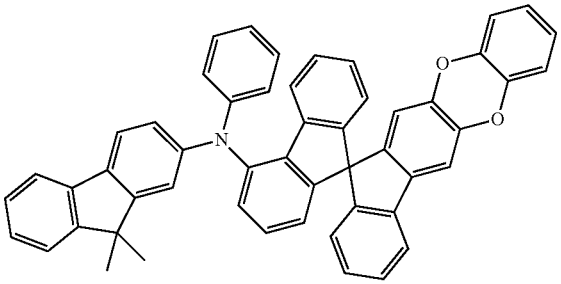
E-LSL-3
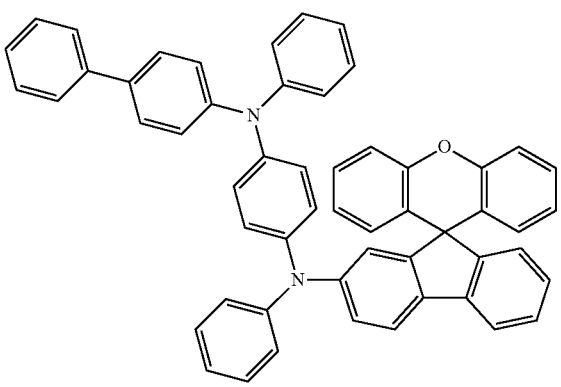

E-LSL-4
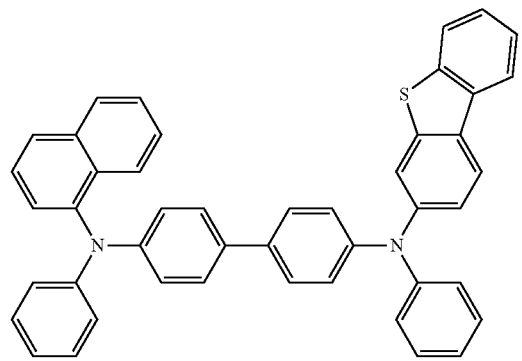
E-LSL-5
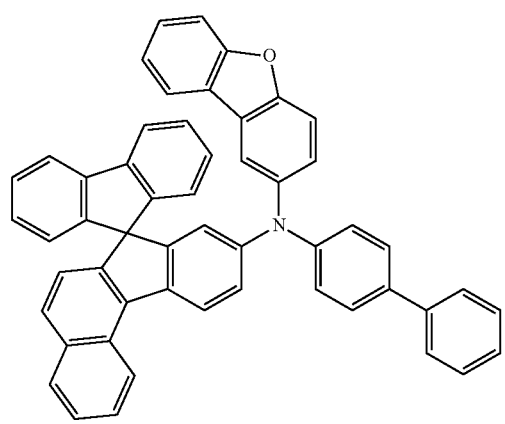
E-LSL-6
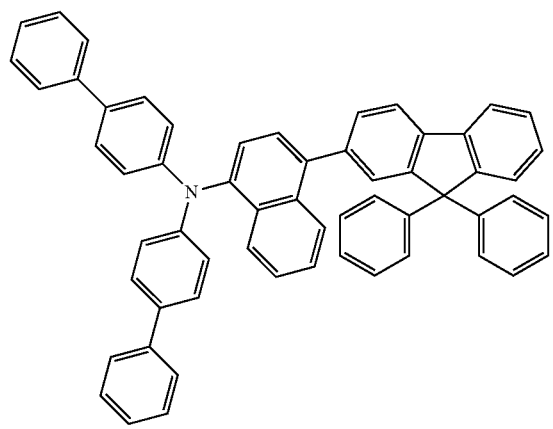
E-LSL-7
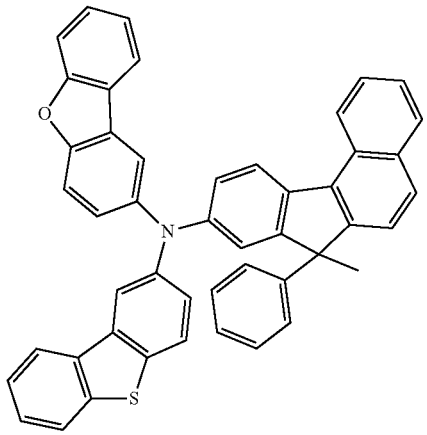
E-LSL-8
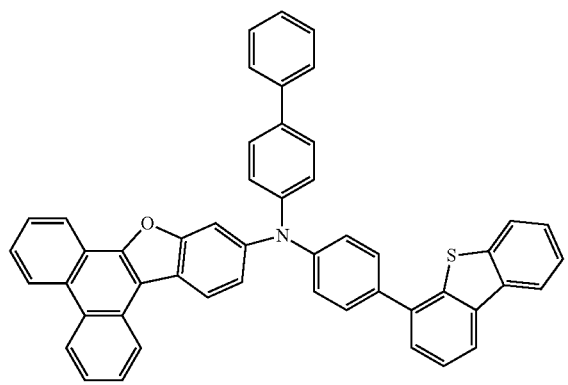
E-LSL-9
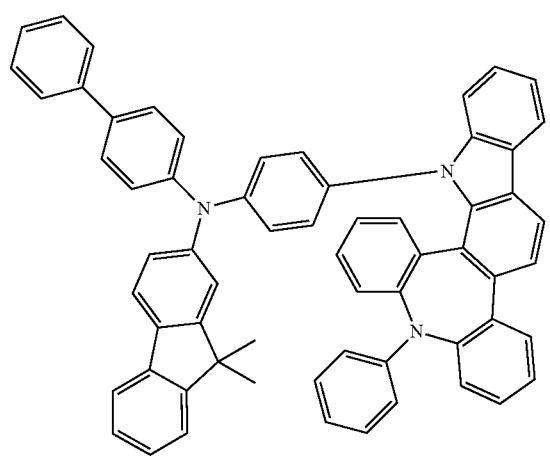

E-LSL-10

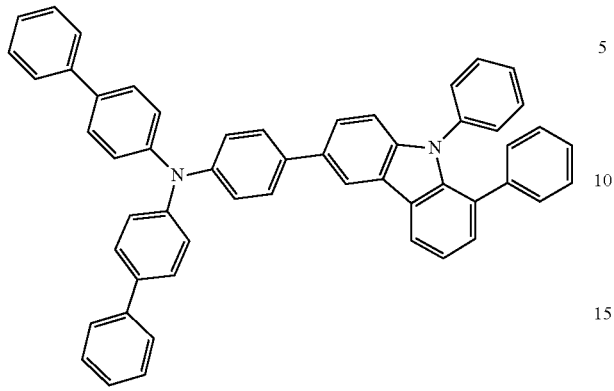

E-LSL-13

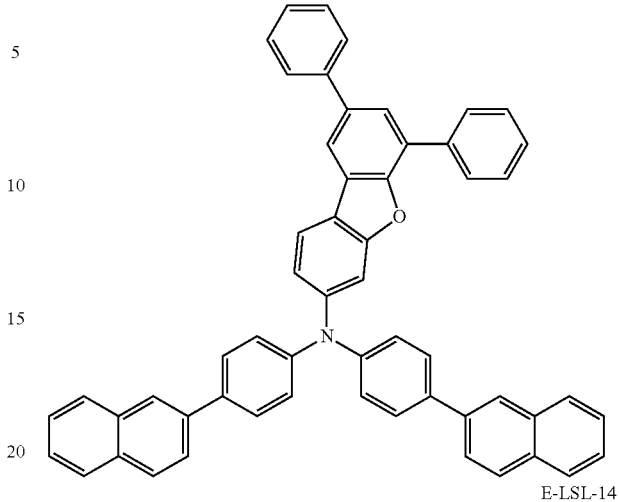

E-LSL-11

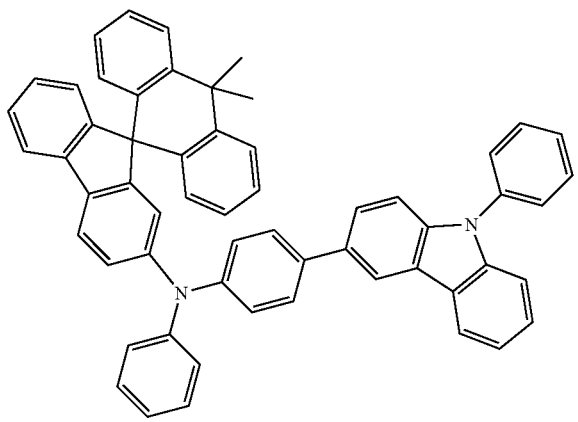

E-LSL-14

E-LSL-12

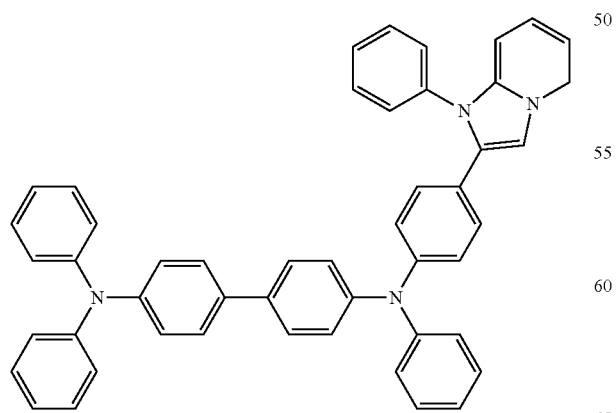

E-LSL-15

[Embodiments 1 to 5] Manufacturing of Blue Organic EL Devices

After respective compounds were subjected to high purity sublimation purification by a conventionally known method, blue organic EL devices were manufactured as follows.

First, a glass substrate thin-film-coated with indium tin oxide (ITO) to a thickness of 1500 Å was washed with distilled water ultrasonically. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, DS-205 (Doosan Electronics CO. LTD., 80 nm)/TCTA (15)/E-LSL-1~E-LSL-5 (5 nm) D NNA+5% DS-405 (Doosan Electronics CO. LTD., 3 nm)/H-LSL-1~H-LSL-5 (5 nm)/TNPT (25 nm)/LiF (1 nm)/Al (200 nm) were stacked in the order, and thus organic EL devices were prepared.

TABLE 2

| | Compound | Thickness (nm) |
|---|---|---|
| Hole injection layer | DS-205 | 80 |
| Hole transporting layer | TCTA | 15 |
| E-LSL | E-LSL-1~E-LSL-5 | 5 |
| Light emitting layer | NNA + 5% DS-405 | 30 |
| H-LSL | H-LSL-1~H-LSL-5 | 5 |
| Electron transporting layer | TNPT | 25 |
| Electron injection layer | LiF | 1 |
| Cathode | Al | 200 |

[Comparative Example 1] Manufacturing of Blue Organic EL Device

A blue organic EL device of Comparative Example 1 was manufactured in the same manner as in Embodiment 1, except that Compound A was used as a material for the electron-leakage suppression layer and Compound B was used as a material for the hole-leakage suppression layer.

For reference, structures of TCTA, NNA, TNPT, Compound A, and Compound B used in Embodiments 1 to 5 are as follows.

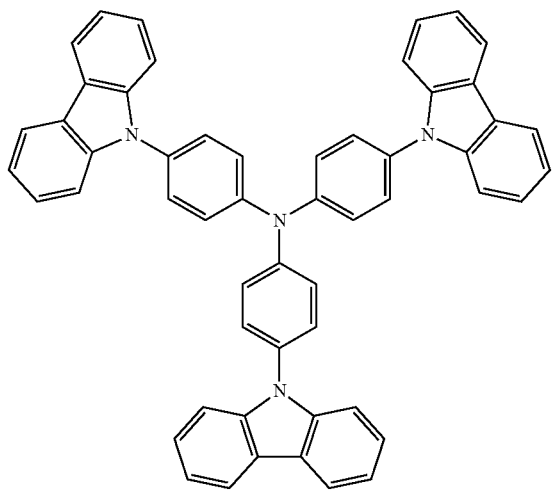

TCTA

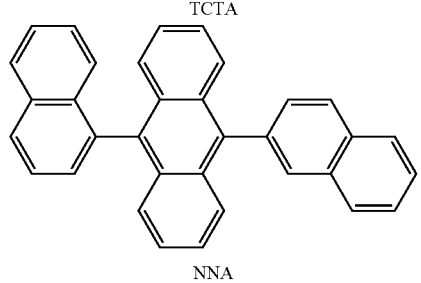

NNA

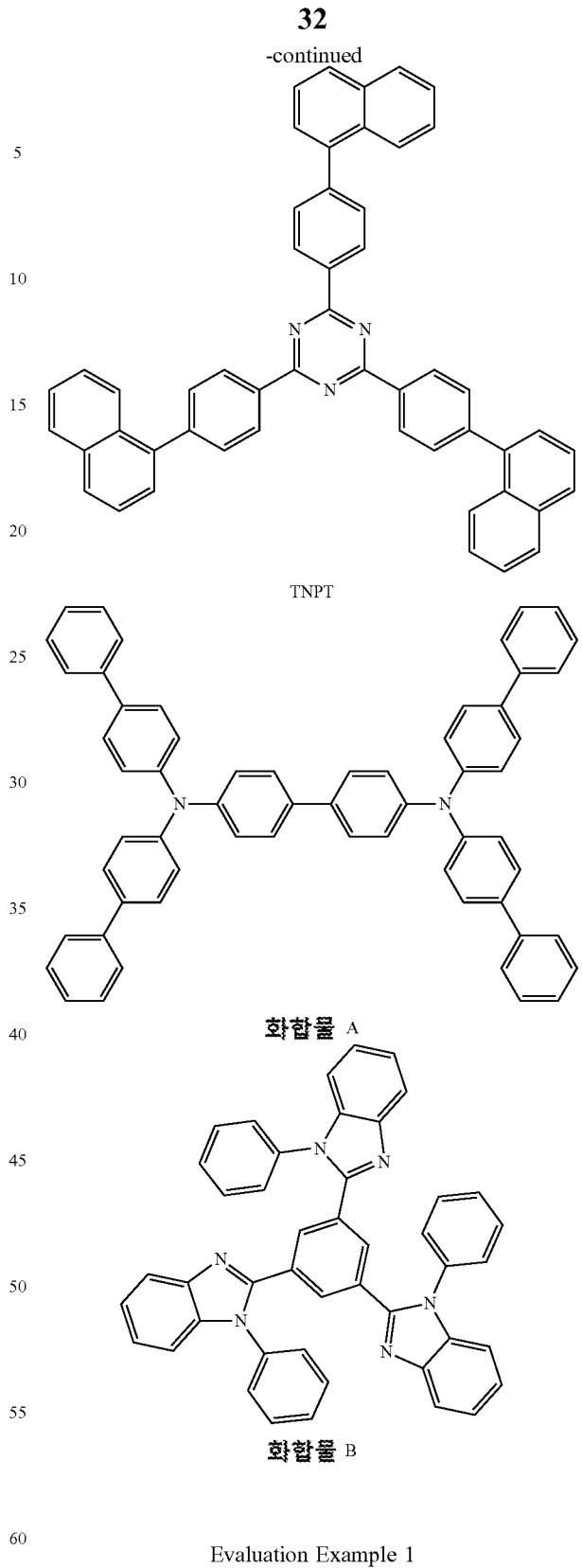

Evaluation Example 1

For each of the organic EL devices manufactured in Embodiments 1 to 5 and Comparative Example 1, a driving voltage and a current efficiency at a current density of 10 mA/cm² were measured and the results are shown in Table 3 below.

TABLE 3

| Embodiment | E-LSL | H-LSL | Driving voltage (V) | Current efficiency (cd/A) |
|---|---|---|---|---|
| Embodiment 1 | E-LSL-1 | H-LSL-1 | 3.69 | 8.1 |
| Embodiment 2 | E-LSL-2 | H-LSL-2 | 3.92 | 7.5 |
| Embodiment 3 | E-LSL-3 | H-LSL-3 | 3.72 | 8.5 |
| Embodiment 4 | E-LSL-4 | H-LSL-4 | 3.97 | 7.6 |
| Embodiment 5 | E-LSL-5 | H-LSL-5 | 3.74 | 8.0 |
| Comp. example1 | Compound A | Compound B | 4.21 | 6.7 |

As shown in Table 3, it was appreciated that the organic EL devices of Embodiments 1 to 5 that include, in the hole transporting area and the electron transporting area, the electron-leakage suppression layer and the hole-leakage suppression layer, adjusted to have predetermined physical properties, exhibited excellent performance in terms of the current efficiency and driving voltage, as compared with the blue organic EL device of Comparative Example 1.

[Embodiments 6 to 10] Manufacturing of Green Organic EL Device

After each compound was subjected to high purity sublimation purification by a conventionally known method, green organic EL devices were manufactured as follows.

First, a glass substrate thin-film-coated with indium tin oxide (ITO) to a thickness of 1500 Å was washed with distilled water ultrasonically. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, m-MTDATA (60 nm)/TCTA (80 nm)/E-LSL-6~E-LSLS-10 (10 nm)/DPDDC+10% Ir(ppy)₃ (300 nm)/H-LSL-6~H-LSL-10 (10 nm)/TNPT (30 nm)/LiF (1 nm)/Al (200 nm) were stacked in the order, and thus organic EL devices were prepared.

Structures of m-MTDATA, DPDDC and Ir(ppy)₃ are as follows.

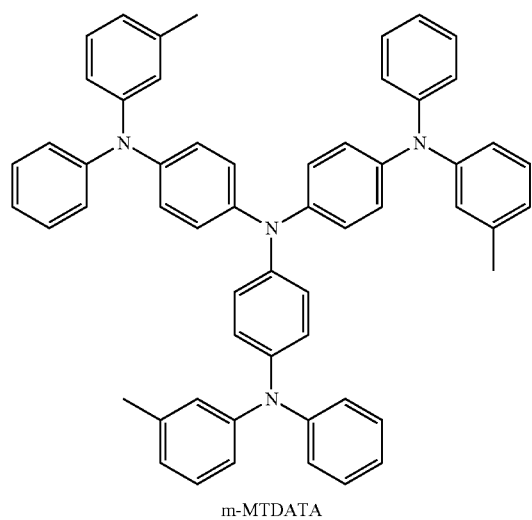

m-MTDATA

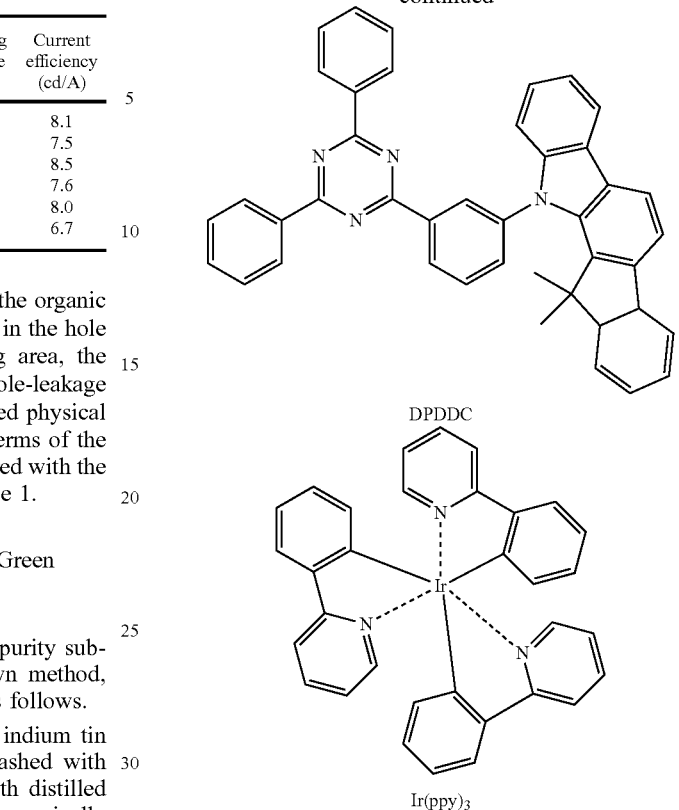

DPDDC

Ir(ppy)₃

[Comparative Example 2] Manufacturing of Green Organic EL Device

A green organic EL device of Comparative Example 2 was manufactured in the same manner as in Embodiment 6, except that Compound A was used as a material for the electron-leakage suppression layer and Compound B was used as a material for the hole-leakage suppression layer.

Evaluation Example 2

For each of the green organic EL devices manufactured in Embodiments 6 to 10 and Comparative Example 2, a driving voltage and a current efficiency at a current density of 10 mA/cm² were measured and the results are shown in Table 4 below.

TABLE 4

| Embodiment | E-LSL | H-LSL | Driving voltage (V) | Current efficiency (cd/A) |
|---|---|---|---|---|
| Embodiment 6 | E-LSL-6 | H-LSL-6 | 4.07 | 135.8 |
| Embodiment 7 | E-LSL-7 | H-LSL-7 | 4.28 | 120.7 |
| Embodiment 8 | E-LSL-8 | H-LSL-8 | 4.06 | 133.3 |
| Embodiment 9 | E-LSL-9 | H-LSL-9 | 4.21 | 124.7 |
| Embodiment 10 | E-LSL-10 | H-LSL-10 | 4.12 | 129.5 |
| Comp. example 2 | Compound A | Compound B | 4.53 | 96 |

As shown in Table 4, it was appreciated that the organic EL devices of Embodiments 6 to 10 that include, in the hole transporting area and the electron transporting area, the electron-leakage suppression layer and the hole-leakage suppression layer, adjusted to have predetermined physical properties, exhibited excellent performance in terms of the current efficiency and driving voltage, as compared with the green organic EL device of Comparative Example 2.

[Embodiments 11 to 15] Manufacturing of Red Organic EL Device

After each compound was subjected to high purity sublimation purification by a conventionally known method, green organic EL devices were manufactured as follows.

First, a glass substrate thin-film-coated with indium tin oxide (ITO) to a thickness of 1500 Å was washed with distilled water ultrasonically. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, m-MTDATA (60 nm)/TCTA (80 nm)/E-LSL-11~E-LSLS-15 (10 nm)/BBCQ+ 10% (piq)$_2$Ir(acac) (300 nm)/H-LSL-11~H-LSL-15 (10 nm)/TNPT (30 nm)/LiF (1 nm)/Al (200 nm) were stacked in the order, and thus organic EL devices were prepared.

[Comparative Example 3] Manufacturing of Red Organic EL Device

A red organic EL device of Comparative Example 3 was manufactured in the same manner as in Embodiment 11, except that Compound A was used as a material for the electron-leakage suppression layer and Compound B was used as a material for the hole-leakage suppression layer.

Structures of BBCQ and (piq)$_2$Ir(acac) used in Embodiments 11 to 15 and Comparative Example 3 are as follows.

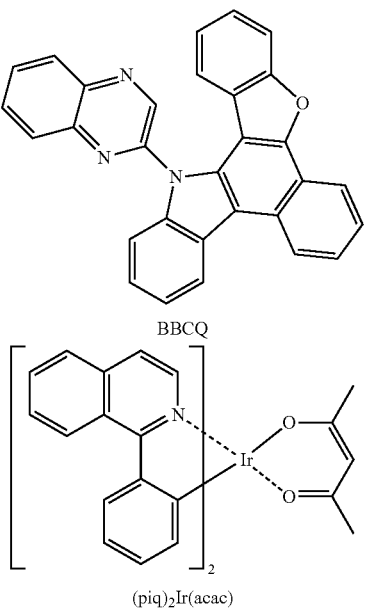

BBCQ (piq)$_2$Ir(acac)

Evaluation Example 3

For each of the red organic EL devices manufactured in Embodiments 11 to 15 and Comparative Example 3, a driving voltage and a current efficiency at a current density of 10 mA/cm$^2$ were measured and the results are shown in Table 5 below.

TABLE 5

| Embodiment | E-LSL | H-LSL | Driving voltage (V) | Current efficiency (cd/A) |
|---|---|---|---|---|
| Embodiment 11 | E-LSL-11 | H-LSL-11 | 3.96 | 38.6 |
| Embodiment 12 | E-LSL-12 | H-LSL-12 | 4.19 | 32.4 |
| Embodiment 13 | E-LSL-13 | H-LSL-13 | 3.94 | 39.2 |
| Embodiment 14 | E-LSL-14 | H-LSL-14 | 4.12 | 33.2 |
| Embodiment 15 | E-LSL-15 | H-LSL-15 | 4.01 | 38.1 |
| Comp. example 3 | Compound A | Compound B | 4.67 | 29 |

As shown in Table 5, it was appreciated that the organic EL devices of Embodiments 11 to 15 that include, in the hole transporting area and the electron transporting area, the electron-leakage suppression layer and the hole-leakage suppression layer, adjusted to have predetermined physical properties, exhibited excellent performance in terms of the current efficiency and driving voltage, as compared with the red organic EL device of Comparative Example 3.

REFERENCE SIGNS

100: Organic electroluminescent device
A: Organic layer
10: Anode
20: Cathode
30: Hole transporting area
31: Hole injection layer
32: Hole transporting layer
33: Electron-leakage suppression layer
40: Light emitting layer
50: Electron transporting area
51: Electron injection layer
52: Electron transporting layer
53: Hole-leakage suppression layer

The invention claimed is:
1. An organic electroluminescent device comprising:
a structure in which an anode; a hole transporting area; a light emitting layer; an electron transporting area, and a cathode are sequentially stacked,
wherein the light emitting layer includes a host,
each of the hole transporting area and the electron transporting area comprises at least two layers,
one of the at least two layers of the hole transporting area contacting the light emitting layer is an electron-leakage suppression layer E-LSL,
one of the at least two layers of the electron transporting area contacting the light emitting layer is a hole-leakage suppression layer H-LSL,
a density of states of HOMO $DOS_{HOMO}$ and a density of states of LUMO $DOS_{LUMO}$ of each of the electron-leakage suppression layer E-LSL and the hole-leakage suppression layer H-LSL satisfy at least one of the following conditions (i) and (ii):
(i) with respect to the density of states of LUMO, a density of states of LUMO $DOS_{LUMO}^{HOST}$ of the host overlaps the density of states of LUMO $DOS_{LUMO}^{H-LSL}$ of the hole-leakage suppression layer H-LSL and does not overlap the density of states of LUMO $DOS_{LUMO}^{E-LSL}$ of the electron-leakage suppression layer E-LSL, and

(ii) with respect to the density of states of HOMO, a density of states of HOMO $DOS_{HOMO}^{HOST}$ of the host overlaps the density of states of HOMO $DOS_{HOMO}^{H\text{-}LSL}$ of the electron-leakage suppression layer E-LSL and does not overlap the density of states of HOMO $DOS_{HOMO}^{H\text{-}LSL}$ of the hole-leakage suppression layer H-LSL.

2. The organic electroluminescent device of claim 1, wherein the densities of states of LUMO $DOS_{LUMO}$ of the electron-leakage suppression layer E-LSL and the hole-leakage suppression layer H-LSL satisfy the condition (i), and the densities of states of HOMO $DOS_{HOMO}$ of the electron-leakage suppression layer E-LSL and the hole-leakage suppression layer H-LSL satisfy the condition (ii).

3. The organic electroluminescent device of claim 1, wherein with respect to the density of states of LUMO $DOS_{LUMO}$, an overlap ratio between the density of states of LUMO $DOS_{LUMO}^{HOST}$ of the host and the density of states of LUMO $DOS_{LUMO}^{H\text{-}LSL}$ of the hole-leakage suppression layer H-LSL is more than 0% and 95% or less.

4. The organic electroluminescent device of claim 1, wherein with respect to the density of states of HOMO $DOS_{HOMO}$, an overlap ratio between the density of states of HOMO $DOS_{HOMO}^{HOST}$ of the host and the density of states of HOMO $DOS_{HOMO}^{E\text{-}LSL}$ of the electron-leakage suppression layer E-LSL is more than 0% and 95% or less.

5. The organic electroluminescent device of claim 1, wherein with respect to an absolute value of the density of states of LUMO $DOS_{LUMO}$, a difference between a minimum LUMO energy value of the density of states of LUMO $DOS_{LUMO}^{HOST}$ of the host and a maximum LUMO energy value of the density of states of LUMO $DOS_{LUMO}^{E\text{-}LSL}$ of the electron-leakage suppression layer E-LSL that do not overlap each other is more than 0 eV and 2 eV or less.

6. The organic electroluminescent device of claim 1, wherein with respect to an absolute value of the density of states of HOMO $DOS_{HOMO}$, a difference between a maximum HOMO energy value of the density of states of HOMO $DOS_{HOMO}^{HOST}$ of the host and a minimum HOMO energy value of the density of states of HOMO $DOS_{HOMO}^{H\text{-}LSL}$ of the hole-leakage suppression layer H-LSL that do not overlap each other is more than 0 eV and 2 eV or less.

7. The organic electroluminescent device of claim 1, wherein the hole transporting area comprises at least one of an electron-leakage suppression layer, a hole transporting layer and a hole injection layer.

8. The organic electroluminescent device of claim 7, wherein with respect to the light emitting layer, the hole transporting area has a structure in which the electron-leakage suppression layer and the hole injection layer are disposed, or
a structure in which the electron-leakage suppression layer, the hole transporting layer, and the hole injection layer are disposed.

9. The organic electroluminescent device of claim 1, wherein the electron transporting area comprises at least one of a hole-leakage suppression layer, an electron transporting layer, and an electron injection layer.

10. The organic electroluminescent device of claim 9, wherein with respect to the light emitting layer, the electron transporting area has a structure in which the hole-leakage suppression layer and the electron injection layer are disposed, or
a structure in which the hole-leakage suppression layer, the electron transporting layer, and the electron injection layer are disposed.

11. The organic electroluminescent device of claim 1, wherein an absolute value difference ΔLUMO between a LUMO energy level of the electron-leakage suppression layer E-LSL and a LUMO energy level of the host is 2.0 eV or less.

12. The organic electroluminescent device of claim 1, wherein an absolute value difference ΔHOMO between a HOMO energy level of the electron-leakage suppression layer E-LSL and a HOMO energy level of the host is 2.0 eV or less.

13. The organic electroluminescent device of claim 1, wherein an absolute value difference ΔLUMO between a LUMO energy level of the hole-leakage suppression layer H-LSL and a LUMO energy level of the host is 2.0 eV or less.

14. The organic electroluminescent device of claim 1, wherein an absolute value difference ΔHOMO between a HOMO energy level of the hole-leakage suppression layer H-LSL and a HOMO energy level of the host is 2.0 eV or less.

15. The organic electroluminescent device of claim 1, wherein a triplet energy T1 of each of the electron-leakage suppression layer E-LSL and the hole-leakage suppression layer H-LSL is 1.5 eV or more.

16. The organic electroluminescent device of claim 1, wherein a singlet energy S1 of each of the electron-leakage suppression layer E-LSL and the hole-leakage suppression layer H-LSL is 2.0 eV or more.

17. The organic electroluminescent device of claim 1, wherein an absolute value of a HOMO energy of each of the electron-leakage suppression layer E-LSL and the hole-leakage suppression layer H-LSL is 4.5 eV or more.

18. The organic electroluminescent device of claim 1, wherein an absolute value of a LUMO energy of each of the electron-leakage suppression layer E-LSL and the hole-leakage suppression layer H-LSL is 1.0 eV or more.

19. The organic electroluminescent device of claim 1, wherein a lowest energy level of bond dissociation energy BDE of each of the electron-leakage suppression layer E-LSL and the hole-leakage suppression layer H-LSL in a ground state is 1.00 eV or more.

20. The organic electroluminescent device of claim 1, wherein each of the electron-leakage suppression layer E-LSL and the hole-leakage suppression layer H-LSL has a refractive index n of 0.6 or more in a blue wavelength area ranging from 400 to 470 nm; or
a dipole moment of each of the electron-leakage suppression layer E-LSL and the hole-leakage suppression layer H-LSL is more than 0.

* * * * *